(12) United States Patent
Ali

(10) Patent No.: US 10,608,654 B2
(45) Date of Patent: Mar. 31, 2020

(54) TRACK AND HOLD CIRCUITS FOR HIGH SPEED AND INTERLEAVED ADCS

(71) Applicant: Analog Devices, Inc., Norwood, MA (US)

(72) Inventor: Ahmed Mohamed Abdelatty Ali, Oak Ridge, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/119,186

(22) Filed: Aug. 31, 2018

(65) Prior Publication Data

US 2019/0131990 A1 May 2, 2019

Related U.S. Application Data

(60) Provisional application No. 62/578,110, filed on Oct. 27, 2017.

(51) Int. Cl.
*H03M 1/10* (2006.01)
*H03M 1/00* (2006.01)
*H03M 1/06* (2006.01)
*H03M 1/12* (2006.01)

(52) U.S. Cl.
CPC ......... *H03M 1/1009* (2013.01); *H03M 1/002* (2013.01); *H03M 1/0639* (2013.01); *H03M 1/1215* (2013.01)

(58) Field of Classification Search
CPC ............................ H03M 1/1009; H03M 1/002
USPC ......................................... 341/122, 155, 159
See application file for complete search history.

(56) References Cited

U.S. PATENT DOCUMENTS

| 7,286,075 | B2 * | 10/2007 | Hennessy | ........... H03M 1/0639 341/144 |
| 8,035,539 | B2 | 10/2011 | Louwsma et al. | |
| 8,089,302 | B2 | 1/2012 | Louwsma et al. | |
| 8,265,118 | B2 | 9/2012 | Tzeng et al. | |
| 8,320,408 | B2 | 11/2012 | Tzeng et al. | |
| 8,497,790 | B1 * | 7/2013 | Lewis | ................. H03M 1/1019 341/118 |
| 8,537,745 | B2 | 9/2013 | Rimini | |
| 9,362,931 | B2 * | 6/2016 | Yamamoto | .......... H03M 1/1009 |

(Continued)

OTHER PUBLICATIONS

32-Channel Sample/Hold Amplifier with Four Multiplexed Inputs, Maxim, Max5166, 19-1456; Rev 0; 8/99, 12 pages.

(Continued)

*Primary Examiner* — Peguy Jean Pierre
(74) *Attorney, Agent, or Firm* — Patent Capital Group

(57) ABSTRACT

Improved track and hold (T/H) circuits can help analog-to-digital converters (ADCs) achieve higher performance and lower power consumption. The improved T/H circuits can drive high speed and interleaved ADCs, and the design of the circuits enable additive and multiplicative pseudo-random dither signals to be injected in the T/H circuits. The dither signals can be used to calibrate (e.g., linearize) the T/H circuits and the ADC(s). In addition, the dither signal can be used to dither any remaining non-linearity, and to calibrate offset/gain mismatches in interleaved ADCs. The T/H circuit design also can integrate an amplifier in the T/H circuit, which can be used to improve the signal-to-noise ratio (SNR) of the ADC or to act as a variable gain amplifier (VGA) in front of the ADC.

20 Claims, 19 Drawing Sheets

(56) References Cited

U.S. PATENT DOCUMENTS

2005/0249298 A1    11/2005  Kim et al.
2010/0149360 A1*    6/2010  Kapusta .................. G06T 1/00
                                                                348/222.1
2015/0214973 A1     7/2015  Man et al.

OTHER PUBLICATIONS

Fu et al., *A Digital Background Calibration Technique for Time-Interleaved Analog-to-Digital Converters*, IEEE Journal of Solid-State Circuits, vol. 33, No. 12, Dec. 1998, 8 pages.

Leonard, *Picking the Right Sample-and-Hold Amp for Various Data-Acquisition Needs*, Application Note, DATEL®, ADC-AN-2, Apr. 4, 2011, 3 pages.

Rakuljic et al., *Suppression of Quantization-Induced Convergence Error in Pipelined ADCs with Harmonic Distortion Correction*, IEEE Transactions on Circuits and Systems—I: Regular Papers, vol. 60, No. 3, Mar. 2013, 10 pages.

Panigada et al., *A 130mW 100MS/s Pipelined ADC with 69dB SNDR Enabled by Digital Harmonic Distortion Correction*, ISSCC 2009, Session 9, Data Converter Techniques, 9.1, 3 pages.

Louwsma et al., *A Time-Interleaved Track & Hold in 0.13μm CMOS sub-sampling a 4 GHz Signal with 43dB SNDR*, IEEE 2007 Custom Integrated Circuits Conference (CICC), 1-4244-1623-X, 4 pages.

Gupta et al., *A 1-GS/s 11-bit ADC with 55-dB SNDR, 250-mW Power Realized by a High Bandwidth Scalable Time-Interleaved Architecture*, IEEE Journal of Solid-State Circuits, vol. 41, No. 12, Dec. 2006, 8 pages.

Louwsma et al., *A 1.6 GS/s, 16 Times Interleaved Track & Hold with 7.6 ENOB in 0.12 μm CMOS*, 07803-8480-6/04 © 2004 IEEE, 4 pages.

Limotyrakis et al., *A 150MS/s 8b 71mW Time-Interleaved ADC in 0.18μm CMOS*, ISSCC 2004, Session 14, High-Speed A/D Converters, 14.4, 10 pages.

Jamal et al., *A 10b 120MSample/s Time-Interleaved Analog-to-Digital Converter with Digital Background Calibration*, ISSCC 2002, Session 10, High-Speed ADCs, 10.4, 3 pages.

* cited by examiner

TRACK AND HOLD CIRCUITS FOR HIGH SPEED AND INTERLEAVED ADCS

PRIORITY APPLICATION

This patent application claims priority to and receives benefit from U.S. Provisional Application, Ser. No. 62/578,110, titled "TRACK AND HOLD CIRCUITS FOR HIGH SPEED AND INTERLEAVED ADCS", filed on Oct. 27, 2017, which is hereby incorporated in its entirety.

TECHNICAL FIELD OF THE DISCLOSURE

The present disclosure relates to the field of integrated circuits, in particular to track and hold circuits for analog-to-digital converters (ADCs).

BACKGROUND

In many electronics applications, an ADC converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, transmitter systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure, features and advantages thereof, reference is made to the following description, taken in conjunction with the accompanying figures, wherein like reference numerals represent like parts, in which.

DETAILED DESCRIPTION

Overview

Figure 1:
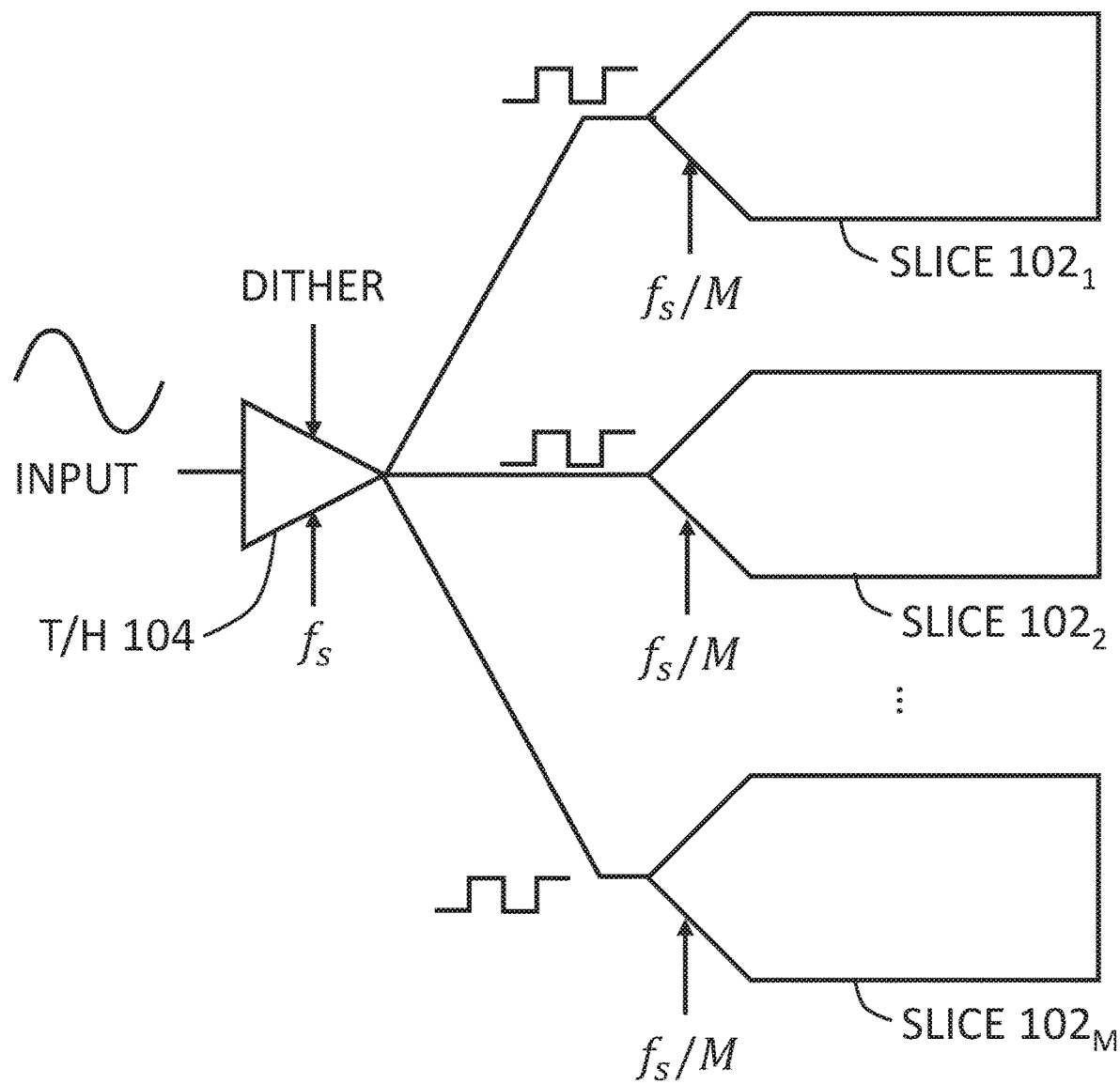
FIG. 1 shows a track and hold circuit driving M ADCs of a time-interleaved ADC, according to some embodiments of the disclosure.

Improved track and hold (T/H) circuits can help ADCs achieve higher performance and lower power consumption. The improved T/H circuits can drive high speed and interleaved ADCs, and the design of the circuits enable additive and multiplicative pseudo-random dither signals to be injected in the T/H circuits. The dither signals can be used to calibrate (e.g., linearize) the T/H circuits and the ADC(s). In addition, the dither signal can be used to dither any remaining non-linearity, and to calibrate offset/gain mismatches in interleaved ADCs. The T/H circuit design also can integrate an amplifier in the T/H circuit, which can be used to improve the signal-to-noise ratio (SNR) of the ADC or to act as a variable gain amplifier (VGA) in front of the ADC.

High Speed ADCs

ADCs are electronic devices that convert a continuous physical quantity carried by an analog signal to a digital output or number that represents the quantity's amplitude (or to a digital signal carrying that digital number). An ADC can be defined by the following application requirements: its speed (number of samples per second), its power consumption, its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), SNR, total harmonic distortion (THD), total harmonic distortion plus noise (THD+N), and spurious free dynamic range (SFDR). ADCs have many different designs, which can be chosen based on the application requirements and specifications.

To achieve higher speeds, interleaving is used to increase the sample rate of ADCs. A time-interleaved ADC can use M ADCs to sample an analog input signal to produce digital outputs. The M ADCs (referred herein as the M slices or M channels), operating in a time-interleaved fashion, can increase the sampling speed several times compared to the sampling speed of just one ADC. The M ADCs can be used in parallel, where the M ADCs can operate to sample an analog input one after another in a time-interleaved fashion. Using appropriate clocking to control the ADCs can greatly increase the effective combined ADC sampling rate. In some cases, the M ADCs are selected sequentially one after another to sample the input signal. In some other cases, the M ADCs can be selected in a pseudo-randomized fashion. Since not all M ADCs are exactly matched or the same, discrete tones (or spurs) would be present if the selection was sequential, e.g., where the M ADCs are used according to a fixed sequence. Pseudo-randomization can help spread the discrete mismatch error tones into the noise floor of the spectrum of the ADC output.

High speed ADCs, typically running at speeds on the order of giga-samples per second, are particularly important in fields such as communications and instrumentation. The input signal can have a frequency in the giga-hertz range, and the ADC may need to sample in the range of giga-samples per second. High frequency input signals can impose many requirements on the circuits receiving the input signal, i.e., the "front end" circuitry of the ADC. The circuit not only has to be fast, for some applications, the circuit needs to meet certain performance requirements, such as SNR and SFDR. Designing an ADC that meets speed, performance, area, and power requirements is not trivial, since faster speeds and higher performance often come at the cost of area and power.

High Speed Track and Hold (T/H) Circuits

Track and hold (T/H) circuits can be an important part of the input circuitry for ADCs. T/H circuits convert the continuous-time input signal into a discrete-time held signal for the ADC(s) which follow the T/H circuits. The ADC(s) can perform conversion based on the discrete-time held signal provided by the T/H circuit. For interleaved ADCs with M ADCs, separate T/H circuits can be provided for each one of the M ADCs, where the individual T/H circuits can run at the (slower) speed of the M ADCs. Running them at the speed of the M ADCs can make the T/H circuits simpler to design. However, distributing the T/H circuits to the M channels means there can be timing and/or bandwidth mismatch between the M channels, since the T/H circuits may not be exactly the same for the M channels. Timing and bandwidth mismatches can be very difficult to measure and address, especially at high speeds.

A different approach is to use a single or dedicated T/H circuit for multiple time-interleaved ADCs so as to avoid timing and/or bandwidth mismatches between the channels. FIG. 1 shows a track and hold circuit driving M ADCs of a time-interleaved ADC, according to some embodiments of the disclosure. FIG. 1 shows a T/H circuit 104 driving M ADCs operating in a time-interleaved fashion, shown as Slice $102_1$, Slice $102_2$, . . . Slice $102_M$ of a time-interleaved ADC, according to some embodiments of the disclosure. In this example, the T/H can operate at sample rate $f_s$ (or the full-speed of the time-interleaved ADC), while each slice can operate operating at a slower rate, such as $f_s/M$. The output of the T/H circuit 104 is a held signal, and each slice is driven by the same held signal. Therefore, the effect of timing and bandwidth (BW) mismatches between the slices can be eliminated.

A fast T/H circuit can be non-trivial to design. High speed T/H circuits can, in some cases, suffer from very high power consumption, high noise, and low performance. The choice to use a faster T/H circuit to drive multiple ADC slices is a deliberate decision between what to optimize in the analog circuit and what to fix with calibration. Since timing and/or bandwidth mismatch is difficult to address, the T/H circuit and the rest of the ADC can be designed to avoid timing and/or bandwidth mismatch problems. Gain and offset mismatches can be more compatible with calibration. Various T/H circuits described herein were designed to facilitate digital calibration of gain and offset mismatches while avoid timing and bandwidth mismatch problems through deliberate analog circuit design.

Herein, the implementations of the T/H circuits are illustrated in single-ended form. In practice, the T/H circuits can be implemented differentially to suppress possible even-order harmonics.

Improved Track and Hold Circuits Allowing Dither Injection

Because a full-speed T/H circuit can be complex and power hungry, certain design decisions were made to ensure the T/H circuit can achieve target performance while not consuming too much power. One way to achieve better performance out of a circuit is to use calibration to linearize the T/H circuit. To allow for calibration, the T/H circuit is designed to incorporate the injection of additive and multiplicative dither into the T/H circuit to enable the calibration of the circuitry downstream from where the dither is injected.

For instance, the calibration of the circuitry can include extracting and calibrating for the non-idealities in the T/H circuit based on the additive dither and/or multiplicative dither. Furthermore, calibration can include extracting and calibrating the offset and gain mismatches between the slices. For instance, adding pseudo-random signal (dither) to the input signal enables the calibration of gain mismatch in time-interleaved ADCs. In addition, the dither can be used to calibrate the T/H circuit non-linearity and ADC non-linearity. Advantageously, additive dither in the T/H circuit can:

Enable non-linear calibration of the T/H circuit's hold phase non-linearity:
　Lower power in T/H circuit,
　Better second harmonic (HD2) and third harmonic (HD3) performance, and
　Simpler switches=>lower power in clocking,
Enable non-linear calibration of the ADC slices' non-linearity:
　Lower power in the ADC slices (e.g., reference buffer, amplifiers, etc.),
　Lower power in the clocking and switching, and
　Better HD2, HD3 performance in the ADC slices',
Enable interleaving gain mismatch calibration in the ADC slices:
　Insensitive to the presence of input signal,
　Insensitive to the input signal frequency,
　More robust calibration, and
　Dither the hold phase spurs.

Furthermore, multiplicative dither (e.g., random chopping) can be used to calibrate offsets and offset mismatches. Advantageously, multiplicative dither in the T/H circuit can:
　Enable robust calibration of offset mismatch between the ADC slices:
　　Independent of the input signal, and
　　Insensitive to "bad" frequencies (e.g., $f_s/M$, M is the number of ADC slices),
　Protect the direct current (DC) input from being zeroed out,
　Dither any remaining offsets, flicker noise, offset mismatch, thermal drifts, etc., and
　Obviate the need for core randomization for offset mismatch.

The additive dither can be injected to correct for one or more of the following: calibration of non-linearity, calibration of memory effects, calibration of chopping non-idealities, calibration of gain error, calibration of gain mismatch in interleaved ADCs, and calibration of track/sampling memory. The multiplicative dither can be used for one or more of the following: correct for offset mismatch and correct for even-order distortion.

Figure 2:
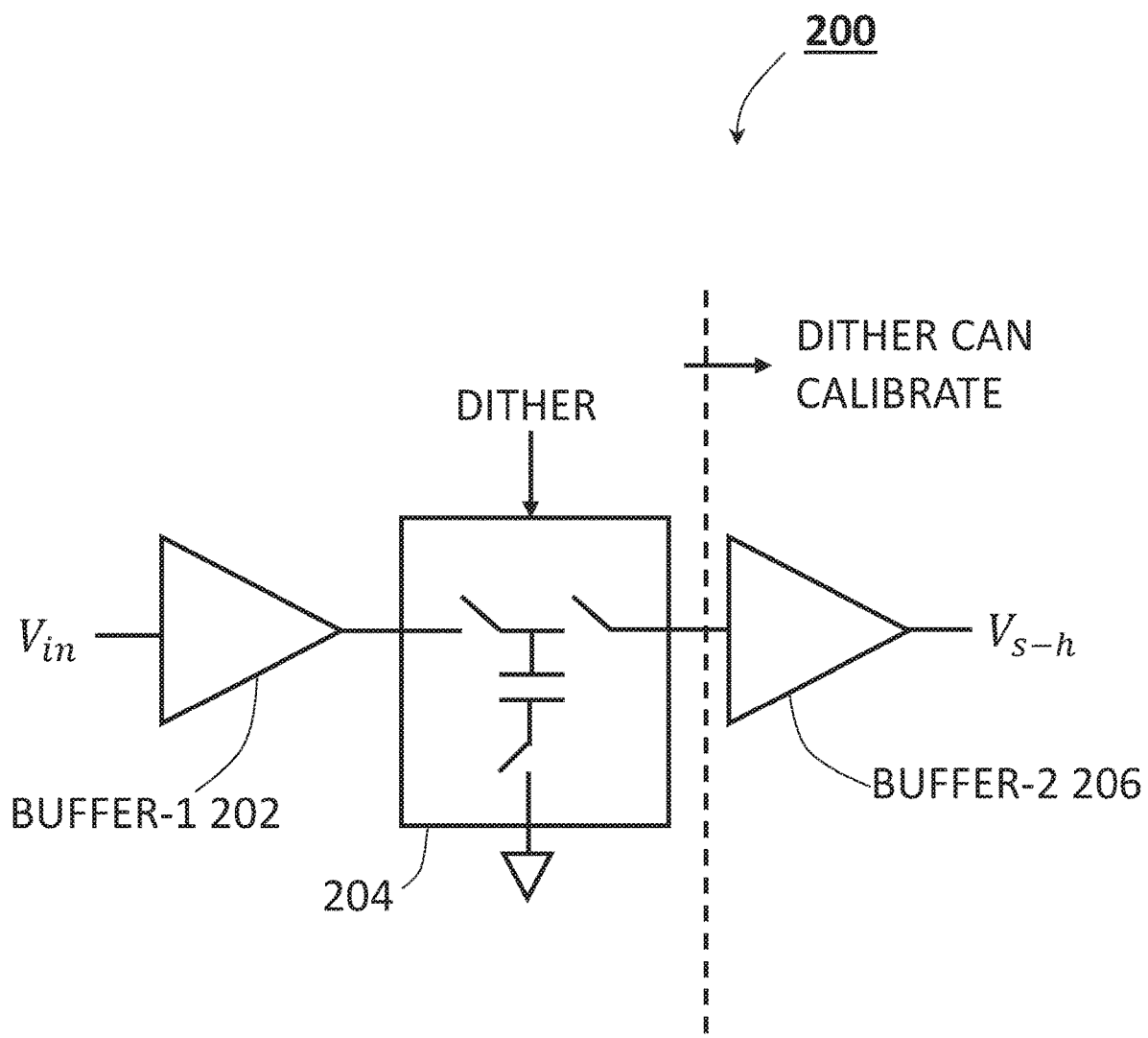
FIG. 2 shows an exemplary track and hold circuit having two buffers and a switched-capacitor network in between, according to some embodiments of the disclosure.

FIG. 2 shows an exemplary T/H circuit 200 having two buffers, Buffer-1 202, and Buffer-2 206 and a switched-capacitor network 204 in between the two buffers, according to some embodiments of the disclosure. Dither can be injected in the switched-capacitor network 204, and the dither can be used to calibrate the Buffer-2 206 and the ADC following the T/H circuit 200. As mentioned before, the dither can be an additive dither or a multiplicative dither. The Buffer-1 202 receives the (voltage) input $V_{in}$, and buffers the input. The buffered input can be sampled on the switched-capacitor network 204. For instance, the switched-capacitor network 204 can sample the buffered input onto capacitor using suitable switches. The buffer-206 can buffer the sampled input and provided the held signal $V_{s-h}$ to an ADC (not shown in FIG. 2).

The T/H circuit 200 can be seen as an open loop T/H circuit. The switched-capacitor network 204 can be a sampling network. Buffer-1 202 can be a sampling buffer, and Buffer-2 206 can be a hold buffer. The buffers are optional, and can be included to provide isolation between different circuit stages. The buffers can be source followers, emitter followers, push pull topology, or any other suitable buffer structure. Buffer-1 202 can be optimized for sampling linearity. Buffer-2 206 can be optimized for low-power, small size, small input capacitance, and good isolation. Isolation for Buffer-2 206 can help reduce input-referred noise of the ADC which follows the T/H circuit 200. The linearity of Buffer-2 206 is not as critical as the linearity of Buffer-1 202 because Buffer-2 206 handles and buffers a held signal. In addition, since dither is injected in the switched-capacitor network 204, the non-linearity of the Buffer-2 206 can be calibrated, which helps further lower the power and size of Buffer-2 206. In addition, the gain and offset mismatches between the ADC slices driven by the T/H circuit can be calibrated by injecting a dither in the switched-capacitor network 204. Different gains of the ADC slices can be measured easily with a dither injected in the shared T/H circuit 200 driving the ADC slices.

One insight of the three-part circuit design of the T/H circuit comes from realizing how to reduce the power consumption of a T/H circuit that has to drive M ADC slices. In the past, an input buffer has to drive M ADC slices, and an input buffer has to be very linear and is likely to consume a lot of power. With the three-part circuit design seen in FIG. 2, the sampling buffer (Buffer-1 202) only needs to drive one sampling network (or, in some cases, 2 to 4 sampling networks depending on the implementation). The (capacitive) load on the sampling buffer can be smaller, and therefore the sampling buffer can consume less power while achieving comparable or better performance, even if the sampling buffer has sample a radio frequency (RF) or high frequency signal. The hold buffer (Buffer-2 206) is driving a held signal, and any problems with the hold buffer can be more benign. The primary requirement for the hold buffer is how well the output of the hold buffer settles. Also, the hold buffer has no input frequency sensitivity. Even though the hold buffer may have to drive M ADC slices, the linearity of the hold buffer is not extremely critical since the hold buffer can be calibrated with the dither being injected in the sampling network. Therefore, power savings can still be achieved.

Track and Hold Circuit with Amplification

Figure 3:
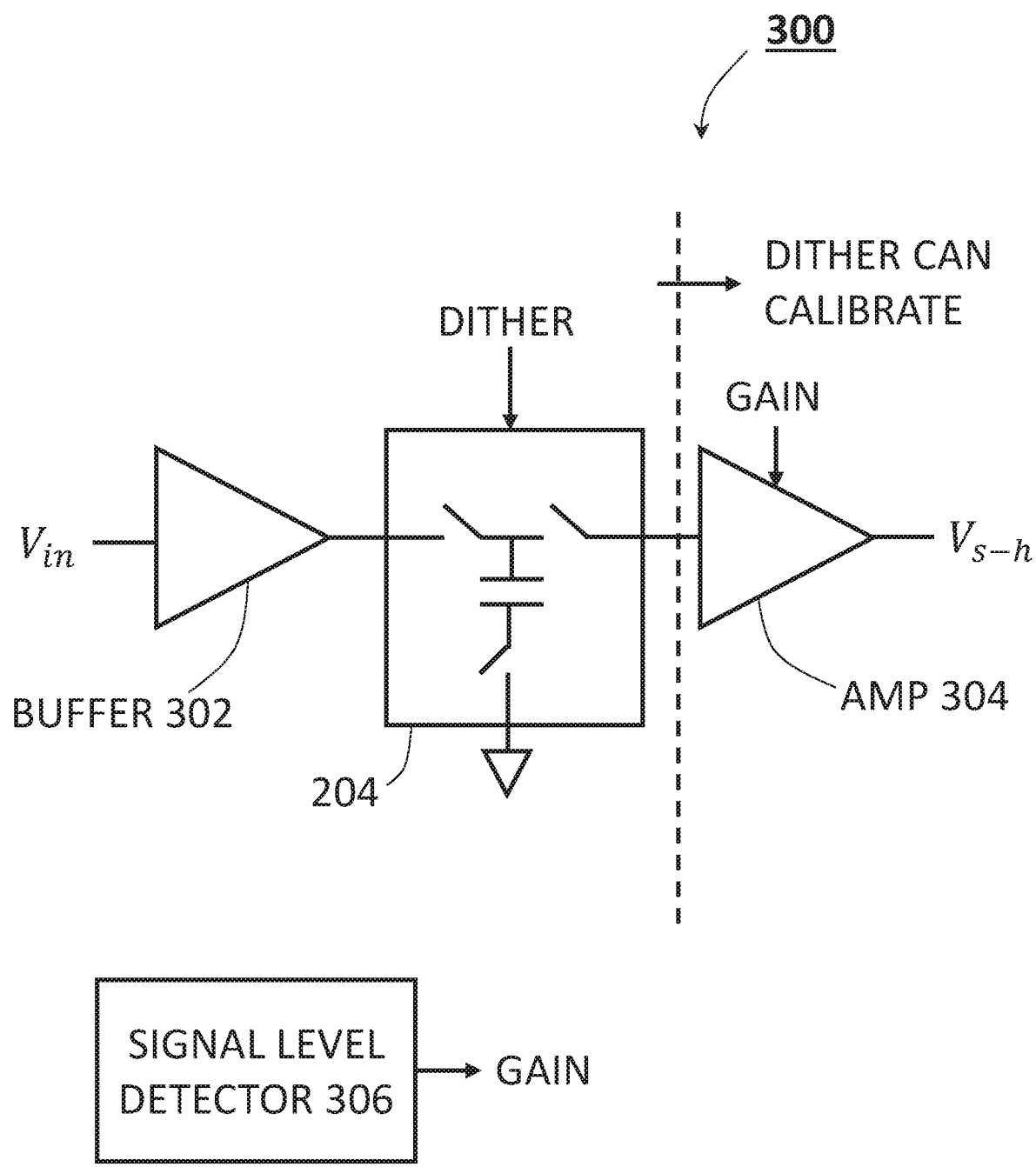
FIG. 3 shows an exemplary track and hold circuit having a buffer, a switched-capacitor network, and an amplifier, according to some embodiments of the disclosure.

Typically for high speed ADCs, amplification is not available in the input circuitry because open loop amplification can be very non-linear. FIG. 3 shows an exemplary T/H circuit 300 having a buffer 302, a switched-capacitor network 204, and an amplifier 304, according to some embodiments of the disclosure. Comparing the T/H circuit 300 with the T/H circuit 200 of FIG. 2, buffer 302 can be similar to Buffer-1 202, but Buffer-2 206 is replaced by amplifier 304. Since the amplifier 304 can be an open loop amplifier, amplifier 304 is likely to suffer from poor linearity. By virtue of having dither injection in the switched-capacitor network 204, the amplifier 304 can be calibrated and any possible non-linearities associated with the amplifier 304 can be addressed. The ability to provide amplification in the T/H circuit 300 is advantageous since it greatly relaxes the requirements on the input signal being provided to the T/H circuit 300. Besides, the amplifier 304 can, just like the Buffer-2 206 of FIG. 2, reduce input-referred noise of the ADC which follows the T/H circuit 300.

Besides providing amplification, the amplifier 304 can be a VGA or provide variable gain. The gain can be varied based on one or more conditions and/or set by one or more specified parameters. A gain control signal "GAIN" can be used to vary the gain provided by amplifier 304. In some embodiments, a signal level detector 306 can be implemented to generate the gain control signal "GAIN" to control the amplifier 304 based on signal level conditions. For instance, if the signal level detector 306 detects an overload condition (e.g., a very large input signal $V_{in}$), the signal level detector 306 can generate an appropriate gain control signal "GAIN" to reduce the gain of the amplifier 304.

Although not shown as an amplifier, buffer 302 can be implemented as an amplifier in some cases. The amplifier in place of buffer 302 can be a variable gain amplifier (e.g., controllable by signal level detector 306). Depending on the implementation, the amplifier is an open loop amplifier, or a closed loop amplifier. A closed loop amplifier may be preferred since they can be more accurate than an open loop amplifier. In some cases, buffer 302 can be preceded by a separate amplifier (open loop or closed loop). Amplification at the sampling side can also relax the requirements on the input signal being provided to the T/H circuit 300.

It is understood that the various embodiments shown herein with a hold buffer such as "Buffer-2" can be replaced with an amplifier 304 as illustrated by FIG. 3.

Sampling Network with Dither Injection

Dither can be injected into a node of the switched-capacitor network of the T/H circuit through different circuit topologies described herein. A dither is a random signal. A dither can have different levels. In one example, a dither can be generated by a digital-to-analog converter receiving a digital input (the dither in digital form) and generating an analog output (the dither in analog form). The analog output from the digital-to-analog converter can be injected into the switched-capacitor network of a T/H circuit. In some cases, a dither can randomly change between positive or negative (e.g., randomly changing between +1, and −1, or +V or −V where V is a nominal value). The type of dither being injected can differ depending on the desired calibration to be performed or effect to be achieved.

Figure 4:
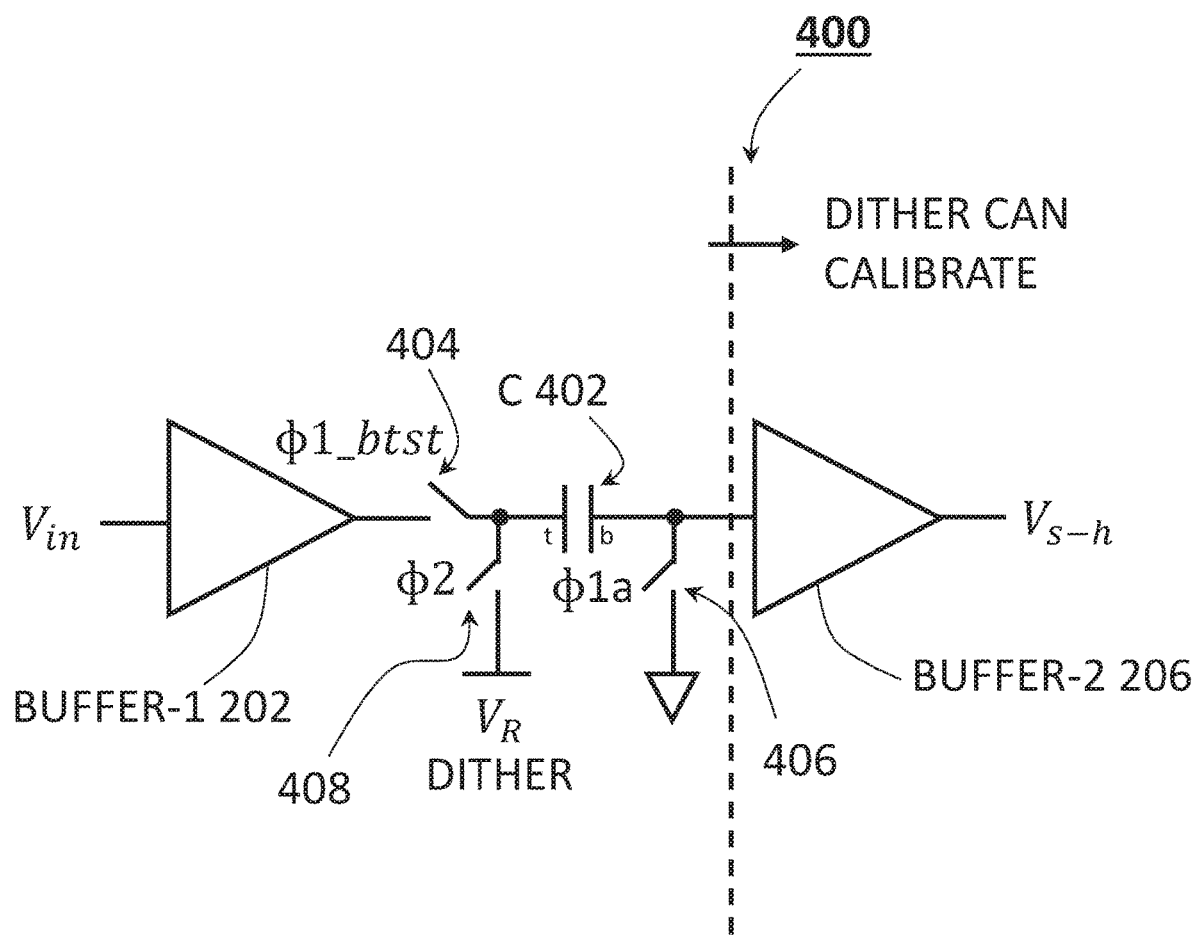
FIG. 4 shows an exemplary track and hold circuit illustrating one exemplary switched-capacitor network with sampling and dither injection, according to some embodiments of the disclosure.

FIG. 4 shows an exemplary T/H circuit 400 illustrating one exemplary switched-capacitor network with sampling and dither injection, according to some embodiments of the disclosure. Dither is injected in the switched-capacitor network at node $V_R$ and can be used to calibrate Buffer-2 206 and the ADC following the T/H circuit 400. The switched-capacitor network has capacitor C 402 for sampling the input, an input switch 404 for receiving the (buffered) input from Buffer-1 202, a sampling switch 406, and a dither injection switch 408. In the FIGURES, various phase ϕ symbols adjacent to the switches indicate a phase or timing indicating when a given switch is closed. Top and bottom plates of capacitor C is indicated as "t" and "b" respectively.

During sampling phase, the input switch 404 having phase ϕ1_btst and the sampling switch 406 having phase ϕ1a are closed. The input switch 404 can be a bootstrapped switch (i.e., bootstrapped to the buffered input) to achieve good linearity. The sampling switch having ϕ1a 406 is advanced (opens before the input switch 404 is opened) to achieve bottom plate sampling. The dither injection switch 408 having phase ϕ2 is opened during the sampling phase. At the end of the sampling phase, the input signal is sampled onto capacitor C 402.

During a hold phase, both the input switch 404 having phase ϕ1_btst and the sampling switch 406 having phase ϕ1a are opened. Dither injection switch 408 having phase ϕ2 closes to connect the top plate of the capacitor C 402 to the node $V_R$. Accordingly, additive dither can be injected in the switched-capacitor network. The T/H circuit 400 holds the sampled voltage (the sampled input signal), plus the additive dither injected, at the output as $V_{s-h}$. In this embodiment, the output bias point of Buffer-1 202 does not need to be compatible with the input bias point of Buffer-2 206. The output $V_{s-h}$ in FIG. 4 is an inverted version of the input $V_{in}$ plus the additive dither injected at node $V_R$.

Figure 5:
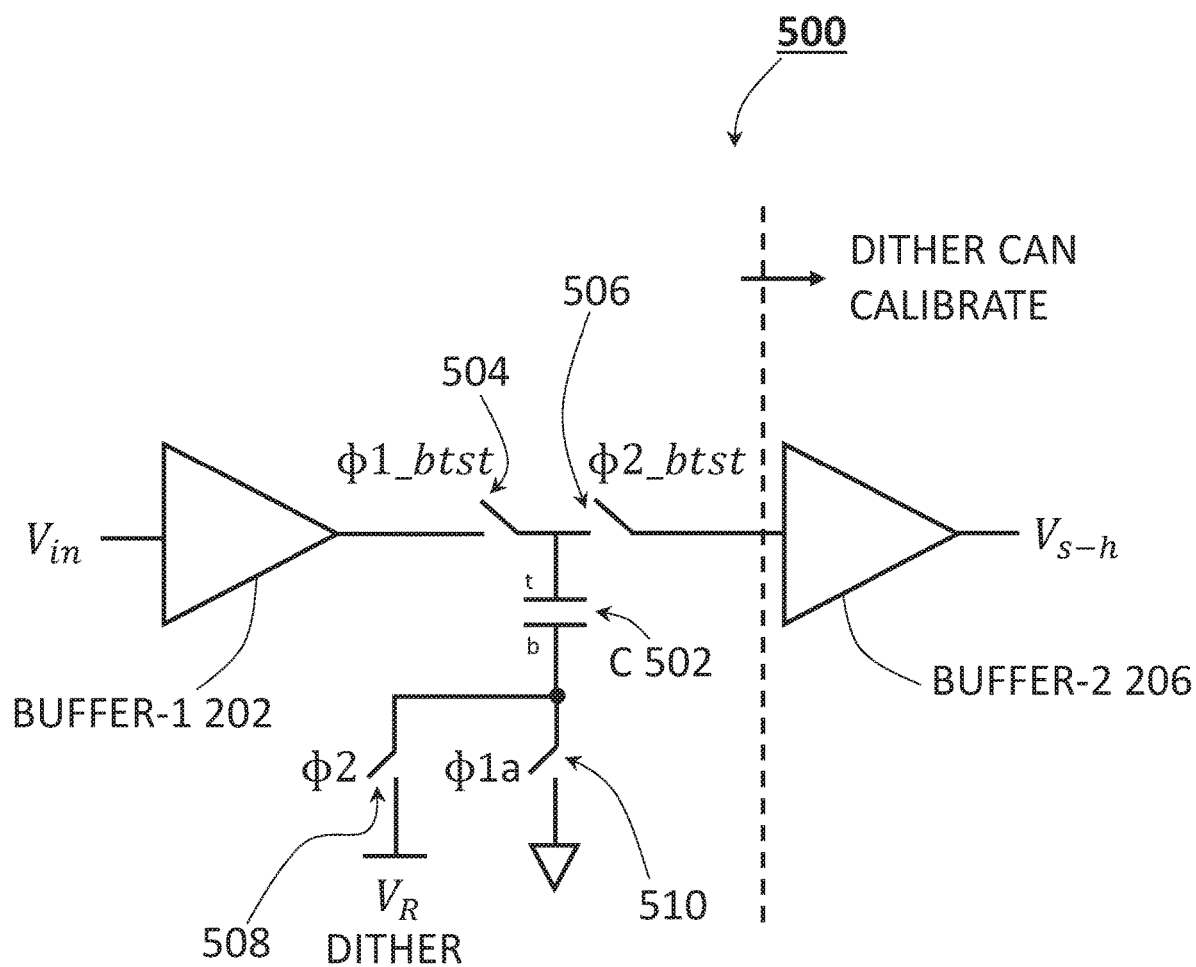
FIG. 5 shows an exemplary track and hold circuit illustrating another exemplary switched-capacitor network with sampling and dither injection, according to some embodiments of the disclosure.

FIG. 5 shows an exemplary T/H circuit 500 illustrating another exemplary switched-capacitor network with sampling and dither injection, according to some embodiments of the disclosure. Similar to FIG. 4, additive dither is injected in the switched-capacitor network and can be used to calibrate Buffer-2 206 and the ADC following the T/H circuit 500. The switched-capacitor network has capacitor C 502 for sampling the input, an input switch 504 for receiving the (buffered) input from Buffer-1 202, a sampling switch 510, a dither injection switch 508, and an output switch 506.

During sampling phase, the input switch 504 having phase ϕ1_btst and the sampling switch 510 having phase ϕ1a are closed. The input switch 504 can be a bootstrapped switch (i.e., bootstrapped to the buffered input) to achieve good linearity. The sampling switch 510 having ϕ1a is advanced (opens before the input switch 504 is opened) to achieve bottom plate sampling. The dither injection switch 508 having phase ϕ2 and the output switch 506 having phase ϕ1_btst are opened during the sampling phase. At the end of the sampling phase, the input signal is sampled onto capacitor C 502.

During a hold phase, both the input switch 504 having phase ϕ1_btst and the sampling switch 510 having phase ϕ1a are opened. Dither injection switch 508 having phase ϕ2 closes to connect the bottom plate of the capacitor C 502 to the node $V_R$. Accordingly, additive dither can be injected in the switched-capacitor network. Output switch 506 having phase ϕ2_btst also closes to connect the capacitor C 502 to the Buffer-2 206. The output switch 506 can optionally be a bootstrapped switch to achieve good linearity. The T/H circuit 500 holds the sampled voltage (the sampled input signal), plus the additive dither injected, at the output as $V_{s-h}$. In this embodiment, the output bias point of Buffer-1 202 is preferably compatible with the input bias point of Buffer-2 206. The output $V_{s-h}$ is a non-inverted version of the input $V_{in}$ plus the additive dither injected at node $V_R$.

Compared to the T/H circuit 400 in FIG. 4, the T/H circuit 500 can have two bootstrapped switches, which can be more complicated and expensive. However, having the two bootstrapped switches can provide better isolation, and can enable using more than one sampling network (e.g., more than one switched-cap network sampling in an interleaved fashion) with the same Buffer-2 206, if needed, to achieve higher speeds.

Output switch 506 does not have to be bootstrapped, since the dither being injected can be used to calibrate output switch 506. If indeed the output switch 506 is bootstrapped, then calibration may not be needed since the output switch 506 is linear enough. If the output switch 506 is not bootstrapped (e.g., just boosted), then calibration can be used to address non-linearities of the output switch 506.

Figure 6:
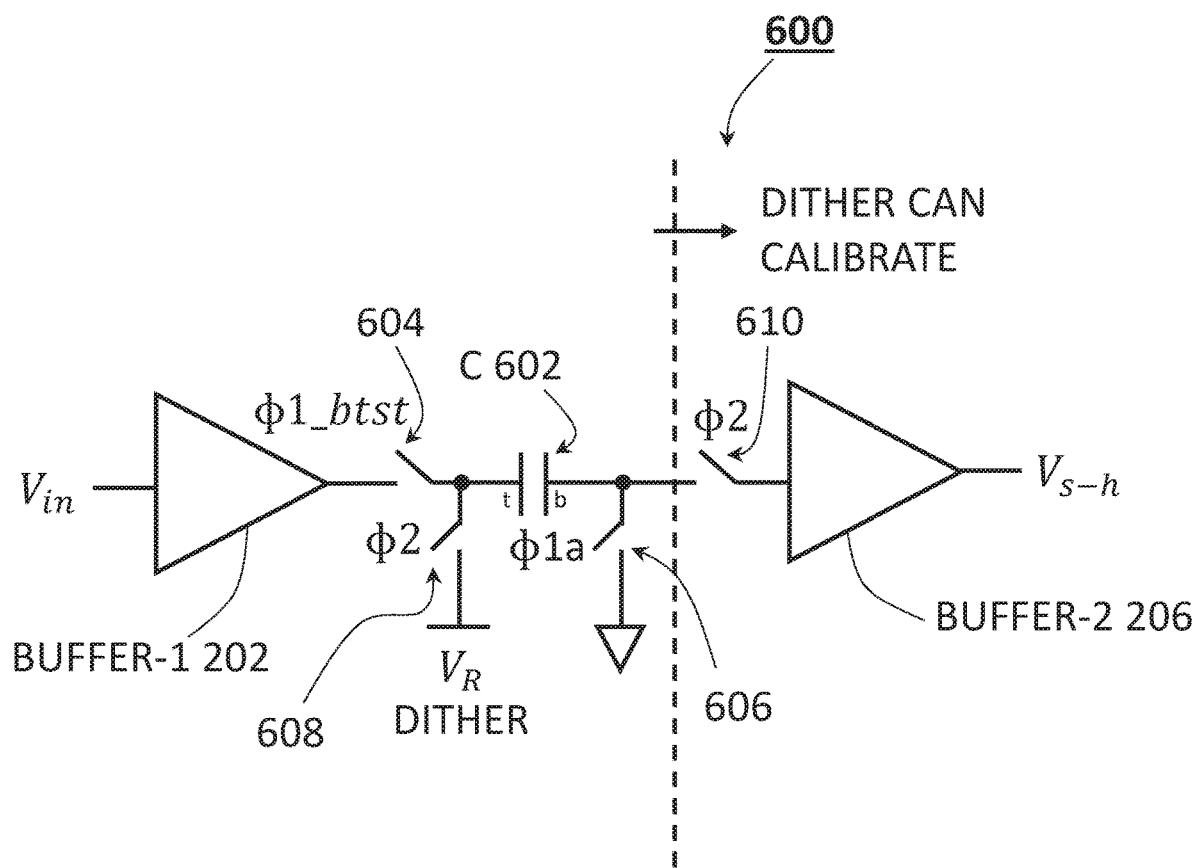
FIG. 6 shows an exemplary track and hold circuit illustrating yet another exemplary switched-capacitor network with sampling and dither injection, according to some embodiments of the disclosure.

FIG. 6 shows an exemplary T/H circuit 600 illustrating yet another exemplary switched-capacitor network with sampling and dither injection, according to some embodiments of the disclosure. Dither is injected in the switched-capacitor network and can be used to calibrate Buffer-2 206 and the ADC following the T/H circuit 600. The switched-capacitor network has capacitor C 602 for sampling the input, an input switch 604 for receiving the (buffered) input from Buffer-1 202, a sampling switch 606, a dither injection switch 608, and an output switch 610. The T/H circuit 600 can be seen as a mix of the T/H circuit 400 of FIG. 4 and T/H circuit 500 of FIG. 5. The sampling is done in a manner similar to FIG. 4, but an additional switch (i.e., the output switch 610) is present in series with the capacitor C 602 to connect the capacitor C 602 during the hold phase and isolate the switched-capacitor network from the Buffer-2 206.

During sampling phase, the input switch 604 having phase ϕ1_btst and the sampling switch 606 having phase ϕ1a are closed. The input switch 604 can be a bootstrapped switch to achieve good linearity. The sampling switch having φ1*a* 606 is advanced (opens before the input switch 604 is opened) to achieve bottom plate sampling. The dither injection switch 608 having phase φ2 and the output switch having phase φ2 are opened during the sampling phase. At the end of the sampling phase, the input signal is sampled onto capacitor C 602.

During a hold phase, both the input switch 604 having phase φ1_*btst* and the sampling switch 606 having phase φ1*a* are opened. Dither injection switch 608 having phase φ2 closes to connect the top plate of the capacitor C 602 to the node $V_R$. Accordingly, additive dither can be injected in the switched-capacitor network. Output switch 610 having phase φ2 also closes to connect the capacitor C 502 to the Buffer-2 206. In some cases, the output switch 610 can be a bootstrapped switch to achieve good linearity. In some cases, the output switch is not bootstrapped. Bootstrapping the output switch 610 is less critical in this case since the output switch 610 can be calibrated using the additive dither being injected. The T/H circuit 600 holds the sampled voltage (the sampled input signal), plus the additive dither injected, at the output as $V_{s-h}$. In this embodiment, the output bias point of Buffer-1 202 does not need to be compatible with the input bias point of Buffer-2 206. The output $V_{s-h}$ is an inverted version of the input $V_{in}$ plus the additive dither injected at node $V_R$.

Track and Hold Circuits with Multiple Hold Buffers

Figure 7:
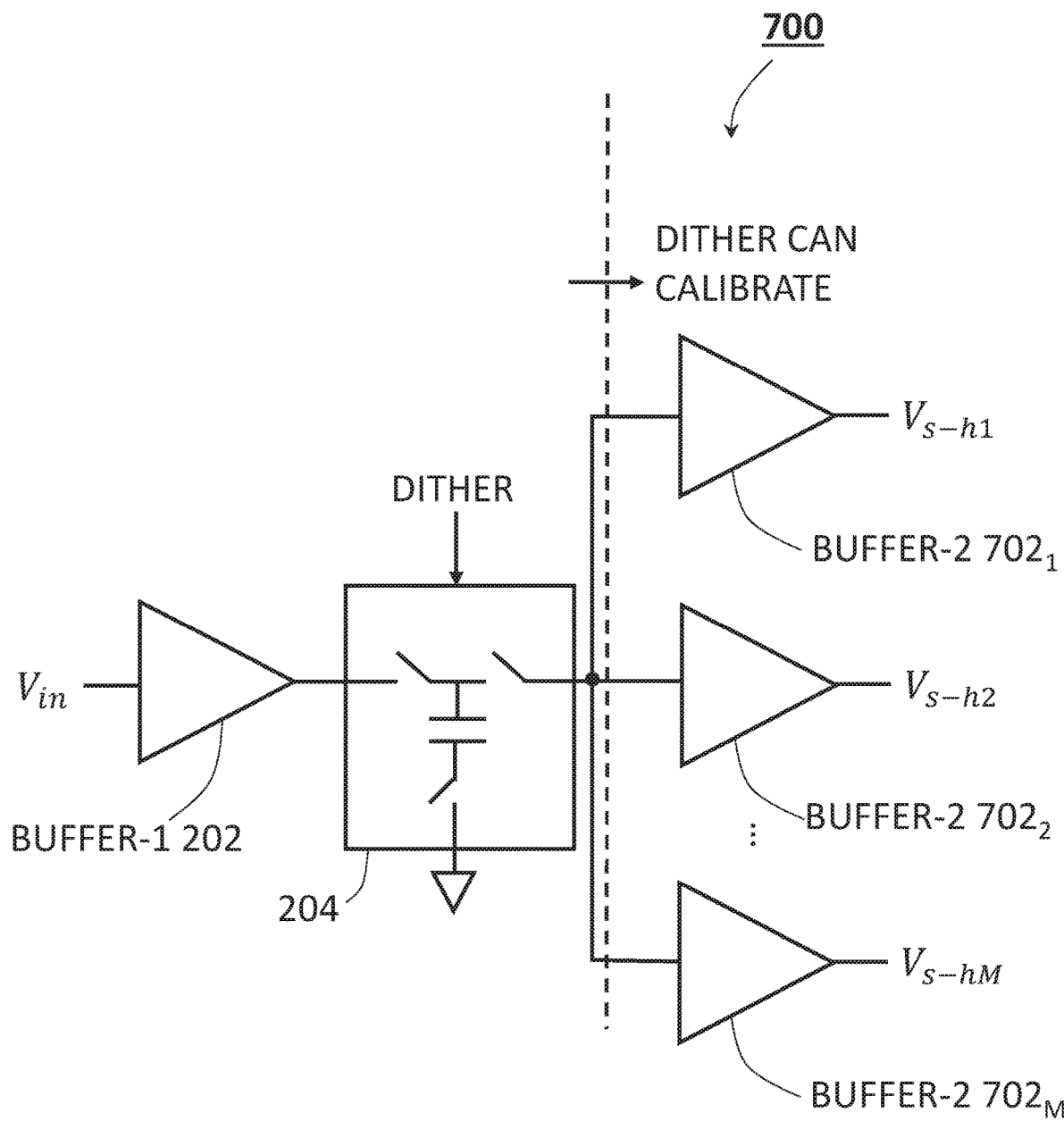
FIG. 7 shows an exemplary track and hold circuit with multiple hold buffers, according to some embodiments of the disclosure.

The T/H circuit can be adapted to drive multiple ADCs. For instance, instead of having a single hold buffer (i.e., Buffer-2 206 of the various FIGURES) driving multiple ADCs, the T/H circuit can duplicate the hold buffer, and the hold buffers can then drive respective ADCs. FIG. 7 shows an exemplary T/H circuit 700 with multiple hold buffers, shown as Buffer-2 702$_1$, Buffer-2 702$_2$, ... Buffer-2 702$_M$, according to some embodiments of the disclosure. Similar to other T/H circuits described herein, the T/H circuit 700 has a sampling buffer Buffer-1 202 and a switched-capacitor network 204. Rather than having just one hold buffer, M hold buffers can be implemented in T/H circuit 700 to drive M ADCs. Each one of the hold buffers can generate a respective output signal $V_{s-h1}$, $V_{s-h2}$, ... $V_{s-hM}$, and drive a respective ADC. Since the hold buffer no longer has to drive multiple ADCs, the Buffer-2 702$_1$, Buffer-2 702$_2$, ... Buffer-2 702$_M$ can be smaller in size than a single hold buffer driving multiple ADCs. In other words, not having to drive multiple ADCs using a single hold buffer can relax the requirements on the hold buffer. Moreover, the hold buffer can be calibrated using the dither being injected into the sampling network. So, the requirements on the hold buffer may be relaxed further due to calibration. Furthermore, having multiple hold buffers can help the T/H circuit 700 have better isolation between the different slices.

In an alternative implementation, the T/H circuit 700 can be adapted to duplicate the sampling network as well. A sampling network per hold buffer can be implemented. For instance, such adapted T/H circuit driving M ADCs can include a sampling buffer, M switched-capacitor networks, and M hold buffers.

Track and Hold Circuits with Time-Interleaved Sampling Networks

Figure 8A:
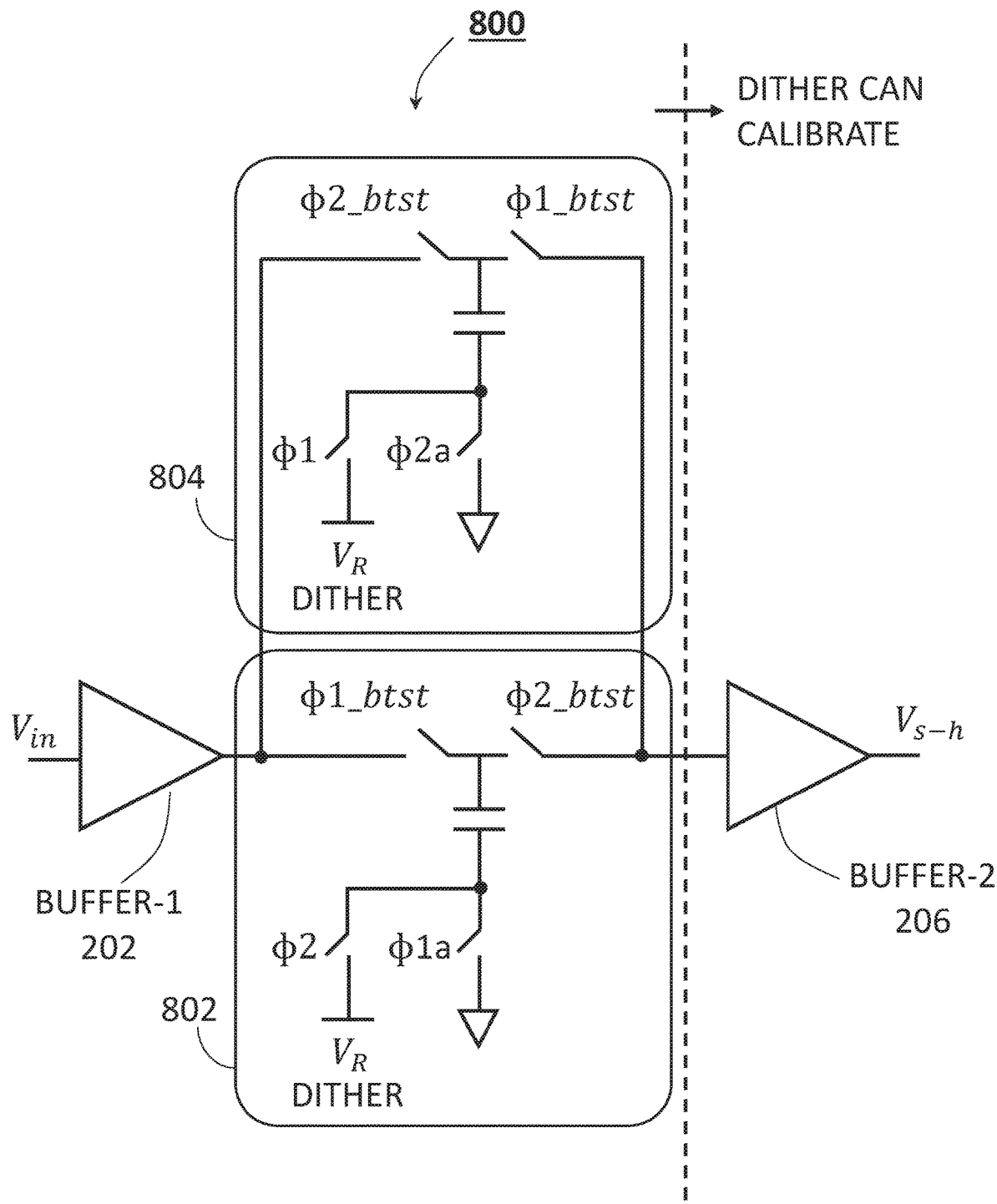
FIG. 8A shows an exemplary track and hold circuit with multiple sampling networks, according to some embodiments of the disclosure.

If it is difficult to implement a full-speed sampling network to sample the input signal, the T/H circuit can be adapted to implement time-interleaving. Rather than having a single switched-capacitor network to sample the input signal, multiple sampling networks can be implemented in the T/H circuit and interleaved in time. FIG. 8A shows an exemplary T/H circuit 800 with multiple sampling networks, shown as sampling network 802 and sampling network 804, according to some embodiments of the disclosure. The T/H circuit 800 has a Buffer-1 202, sampling network 802 and sampling network 804, and a Buffer-2 206. The sampling network 802 and sampling network 804 as shown has the circuit topology illustrated in FIG. 5, however, other circuit topologies for the sampling networks 802 and 804 (e.g., one shown in FIG. 6) can be used. The circuit topology of the sampling network illustrated in FIG. 4 without the output switch can also be used, but the T/H circuit may need to duplicate hold buffers as well. The circuit topologies of the sampling network in FIGS. 5 and 6 having the output switch may obviate the need to have multiple hold buffers.

Figure 8B:
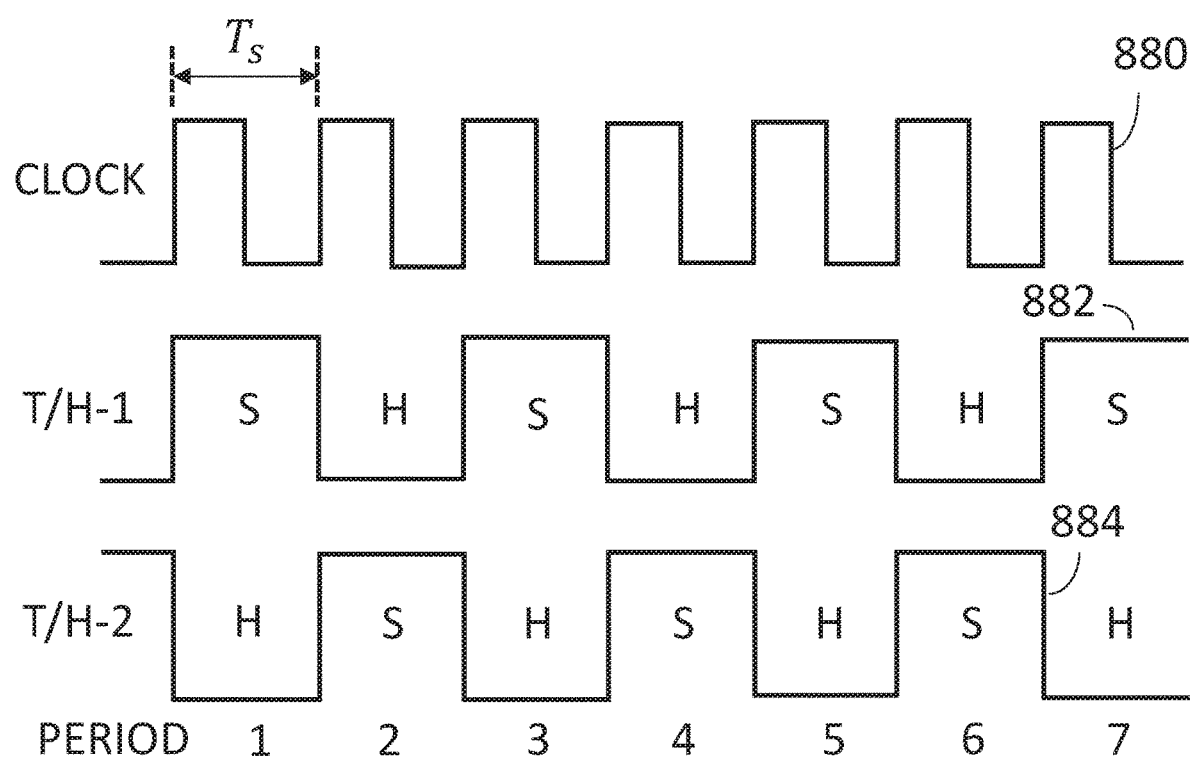
FIG. 8B illustrates timing for the track and hold circuit of FIG. 8A, according to some embodiments of the disclosure.

In this example, the sampling network 802 and the sampling network 804 can ping-pong with each other, sampling the (buffered) input signal one after another in a time-interleaved manner. FIG. 8B illustrates timing for the T/H circuit 800 of FIG. 8A, according to some embodiments of the disclosure. Clock (plot 880) illustrates the full-speed clock at frequency $f_s$, having a period $T_s$. As seen in the timing diagram, an interleaved sampling network (e.g., sampling network 802 and sampling network 804) can run at a frequency of $f_s$/2. T/H-1 (plot 882) illustrates the phases of sampling network 802; T/H-2 (plot 884) illustrates the phases of sampling network 804. During the first period of the full-speed clock, the sampling network 802 is in a sampling phase, and the sampling network 804 is in a hold phase. Switches associated with φ1 (e.g., φ1_*btst* and φ1*a*) in FIG. 8A can be closed accordingly for both sampling networks. Switches associated with φ2 (e.g., φ2_*btst* and φ2*a*) in FIG. 8A can be open accordingly for both sampling networks. During the second period, the sampling network 802 proceeds to a hold phase, and the sampling network 804 goes to a sampling phase. Switches associated with φ2 (e.g., φ2_*btst* and φ2*a*) in FIG. 8A can be closed accordingly for both sampling networks. Switches associated with φ1 (e.g., φ1_*btst* and φ1*a*) in FIG. 8A can be open accordingly for both sampling networks. During the third period, the sampling network 802 returns to a sampling phase, and the sampling network 804 proceeds to a hold phase. Switches associated with φ1 (e.g., φ1_*btst* and φ1*a*) in FIG. 8A can be closed accordingly for both sampling networks. Switches associated with φ2 (e.g., φ2_*btst* and φ2*a*) in FIG. 8A can be open accordingly for both sampling networks. The ping-pong behavior can repeat over time (e.g., over many periods).

With time-interleaved sampling networks, the speed of a single sampling network can be significantly reduced. For instance, sampling network 802 and sampling network 804 would only need to sample the input at half the full-speed of the T/H circuit 800. While two sampling networks are shown, it is appreciated that more than two sampling networks can be time-interleaved or included in the T/H circuit, depending on the desired order of interleaving for the application.

While FIG. 8A illustrates a single hold buffer, it is possible to have a dedicated hold buffer per sampling network. In such a case, if the M ADC slices are operating in a sequential time-interleaved manner, each buffer can drive just M/2 ADC slices.

Figure 9:
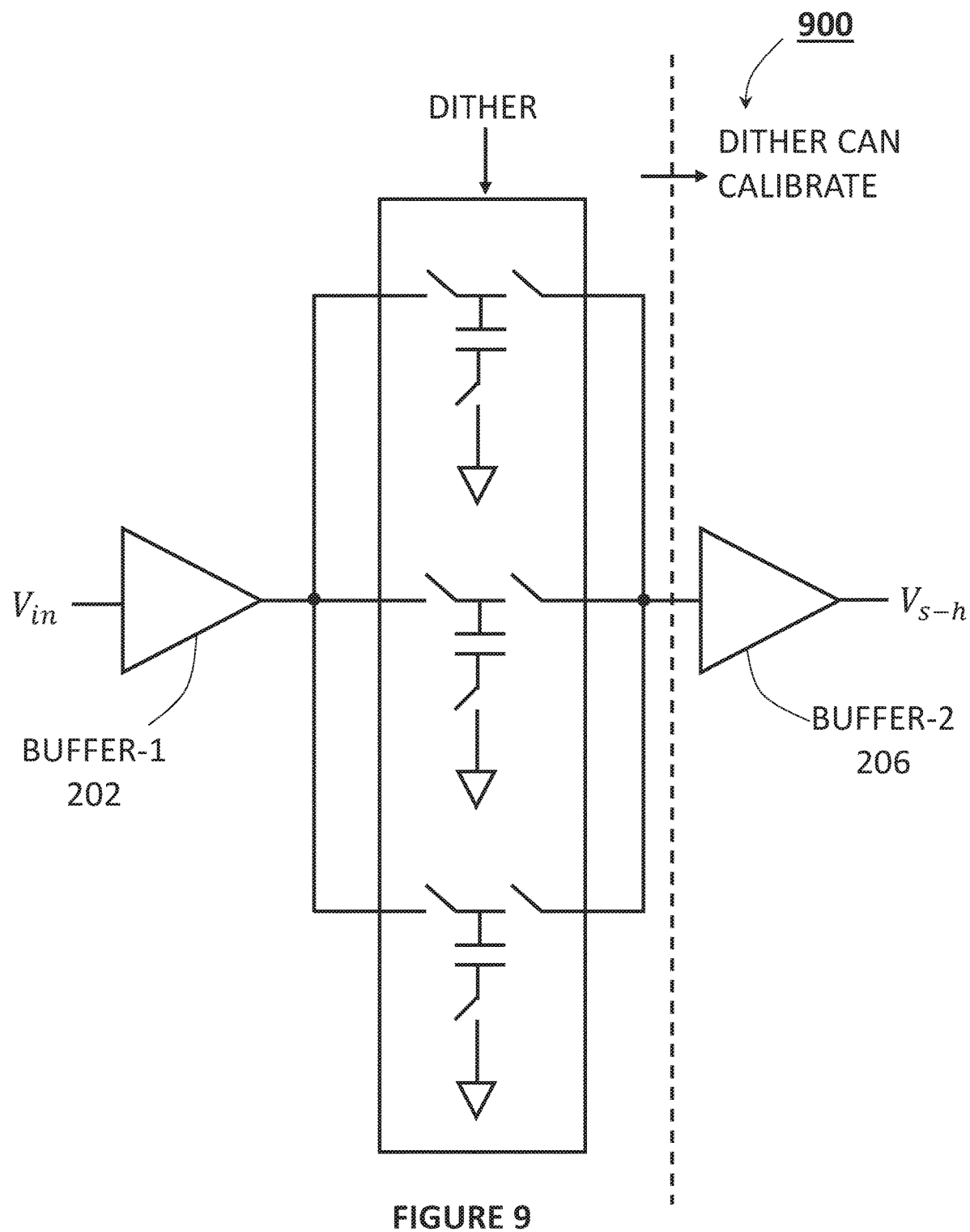
FIG. 9 shows another exemplary track and hold circuit with multiple sampling networks, according to some embodiments of the disclosure.

With time-interleaved sampling networks, the T/H circuit can be exposed to mismatches between the sampling networks. For instance, mismatches between the switches enabling bottom plate sampling can contribute to sampling performance degradation if they are not addressed. Specifically, those mismatches can create undesirable spurs in the output. Unfortunately, the dither cannot help with calibrating such mismatches. To address such mismatches, an additional sampling network can be added to enable randomization. FIG. 9 shows another exemplary T/H circuit 900 with multiple sampling networks, according to some embodiments of the disclosure. Three sampling networks are shown, and it is appreciated that other higher number of sampling networks can be implemented. For this example, at any given period, two sampling networks may be available for sampling the input. One of the two sampling networks can be selected to sample the input at random. Randomizing the sampling network selection (e.g., where the sampling networks sample the buffered input in a randomized time-interleaved manner) can randomize the mismatches between the sampling networks, and push the tones from the mismatches towards the noise floor.

In general, randomization can be enabled by adding one or more additional sampling networks than the minimum number of sampling networks desired for achieving the desired sampling rate. Suppose two sampling networks is needed to achieve the desired sampling rate, adding one (or more) sampling networks can allow for randomization.

In some embodiments, adding more sampling networks can enable higher order time-interleaving, or more functions. For instance, more randomization can be introduced by providing more sampling networks, making more sampling networks available for selection at a given period.

In some cases, a fourth or further sampling network can be added to enable the resetting of each network after its hold phase and before being ready for the next sampling phase. In other words, a sampling network proceeds to a reset phase after the hold phase to allow the circuits to clear (a sampling network may need three periods rather than just two periods before it can sample the input again). By adding an additional sampling network, more time is allowed for resetting the sampling capacitor(s). Effectively, the sampling capacitor(s) within a sampling network that just finished its hold phase can be reset fully to reset any memory in the sampling capacitor(s). The memory can be present on sampling capacitor(s) when switching between the hold phase back to the sampling phase, if additional reset time/phase is not provided for the sampling capacitor(s). If an additional sampling network is provided to allow for resetting, at a given point in time, two sampling networks are busy, one sampling network can be ready to be used or selected at the next period, and one sampling network can be in the reset phase so that it can be used or selected at the next period after the sampling network is reset.

Figure 10:
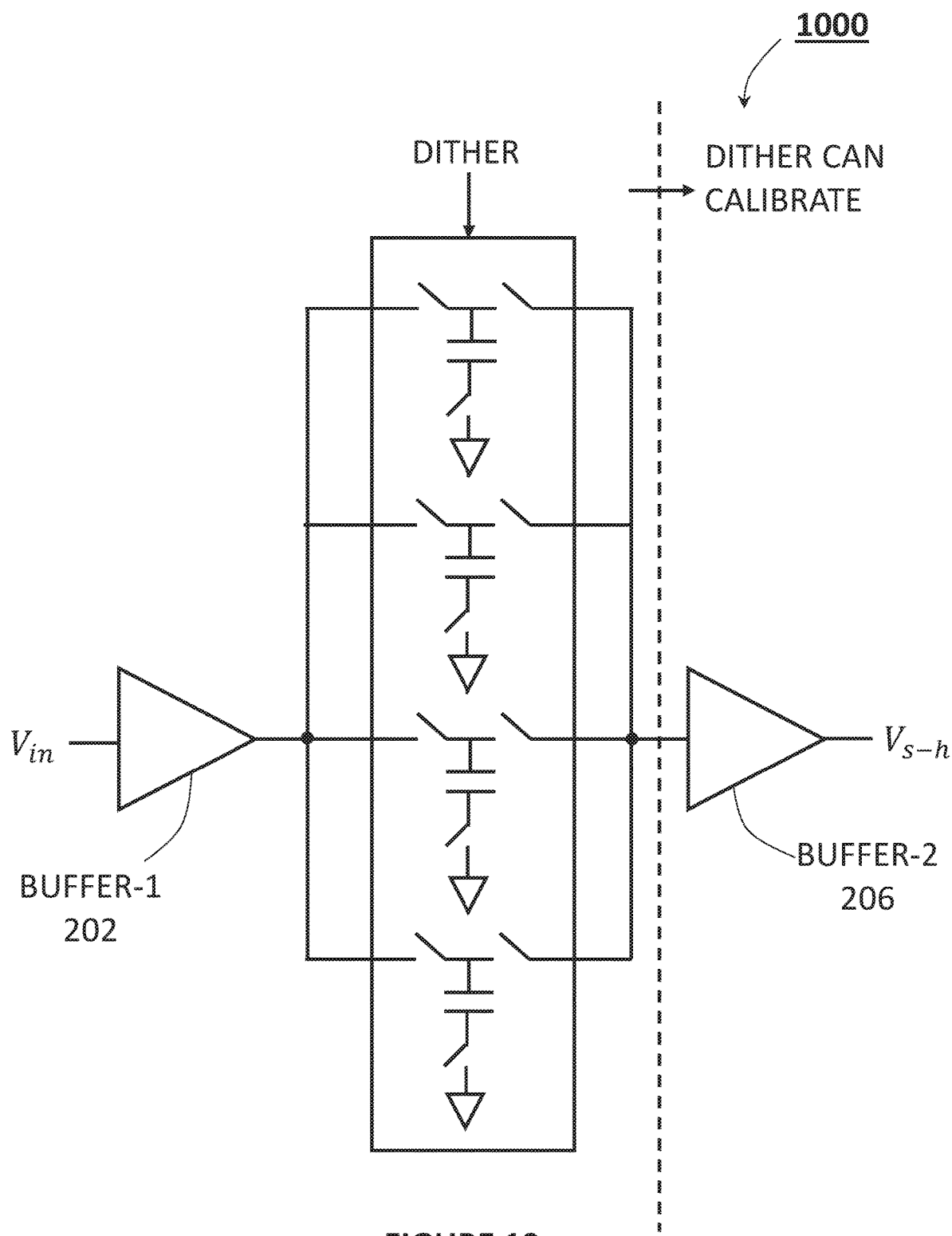
FIG. 10 shows yet another exemplary track and hold circuit with multiple sampling networks, according to some embodiments of the disclosure.

FIG. 10 shows yet another exemplary T/H circuit 1000 with multiple sampling networks, according to some embodiments of the disclosure. As seen in FIG. 10, an additional (fourth) sampling network is provided to ensure there is at least two available sampling networks to select from at a given period to be the next sampling network to sample the input. Having an additional sampling network allows a given sampling network to take an additional period to reset before the given sampling network has to sample the input again. Providing the additional reset phase can help to get reduce or address the memory effects and/or order-dependent effects that can be detrimental to the performance of the T/H circuit, especially when randomization is employed.

In some cases, the time-interleaving sampling networks of a T/H circuit can be configured to operate in different modes of operation. For instance, the clocking of the switches in the sampling networks can be controlled differently depending on the specified mode. The sampling networks can operate in a sequential mode or a randomized mode. The sampling network can operate in a mode that requires a reset phase or in a mode that does not require a reset phase. The desired mode can be specified by one or more user-provided signals, or one or more signals from circuitry suitable for setting the mode.

Figure 11:
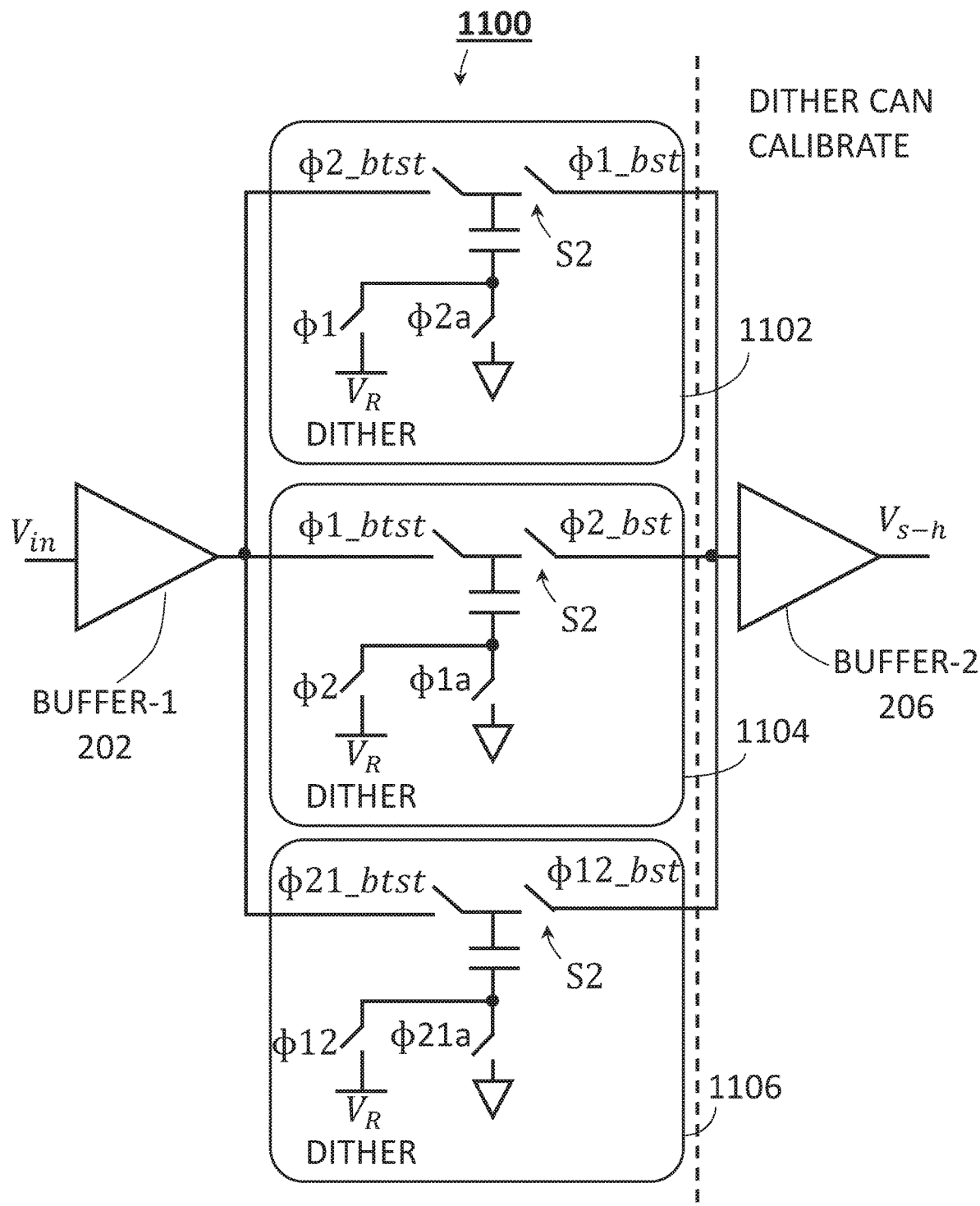
FIG. 11 shows an exemplary track and hold circuit with multiple time-interleaved sampling networks and a single hold buffer, according to some embodiments of the disclosure.

FIG. 11 shows an exemplary T/H circuit 1100 with multiple time-interleaved sampling networks (seen as sampling networks 1102, 1104, and 1106) and a single hold buffer, according to some embodiments of the disclosure. As an example, implementation for three sampling networks of FIG. 9 is shown, based on the circuit topology of the sampling network seen in FIG. 5. It is appreciated that the circuit topology of the sampling network seen in FIG. 6 can also be used as the sampling networks of T/H circuit 1100. To use a single hold buffer, it is preferable for each sampling network to include an output switch. In this case, the output switch in the sampling networks (labeled as S2 switches with respective phases $\phi 1\_bst$, $\phi 2\_bst$, and $\phi 12\_bst$ in FIG. 11) does not have to be a bootstrapped switch. Rather, it can be a simpler boosted switch instead (e.g., a transmission gate). The output switches can be calibrated using the dither injected in the sampling network, and therefore the design requirements on the analog circuit of the output switches can be relaxed. For this particular example shown, the sampling networks sample the buffered input from Buffer-1 202 in a randomized time-interleaved manner. In other words, one out of two available sampling networks can be randomly selected to be the next sampling network to sample the input to randomize mismatch errors between the sampling networks. The circuit design shown in FIG. 11 can be extended to higher number of sampling networks.

Figure 12:
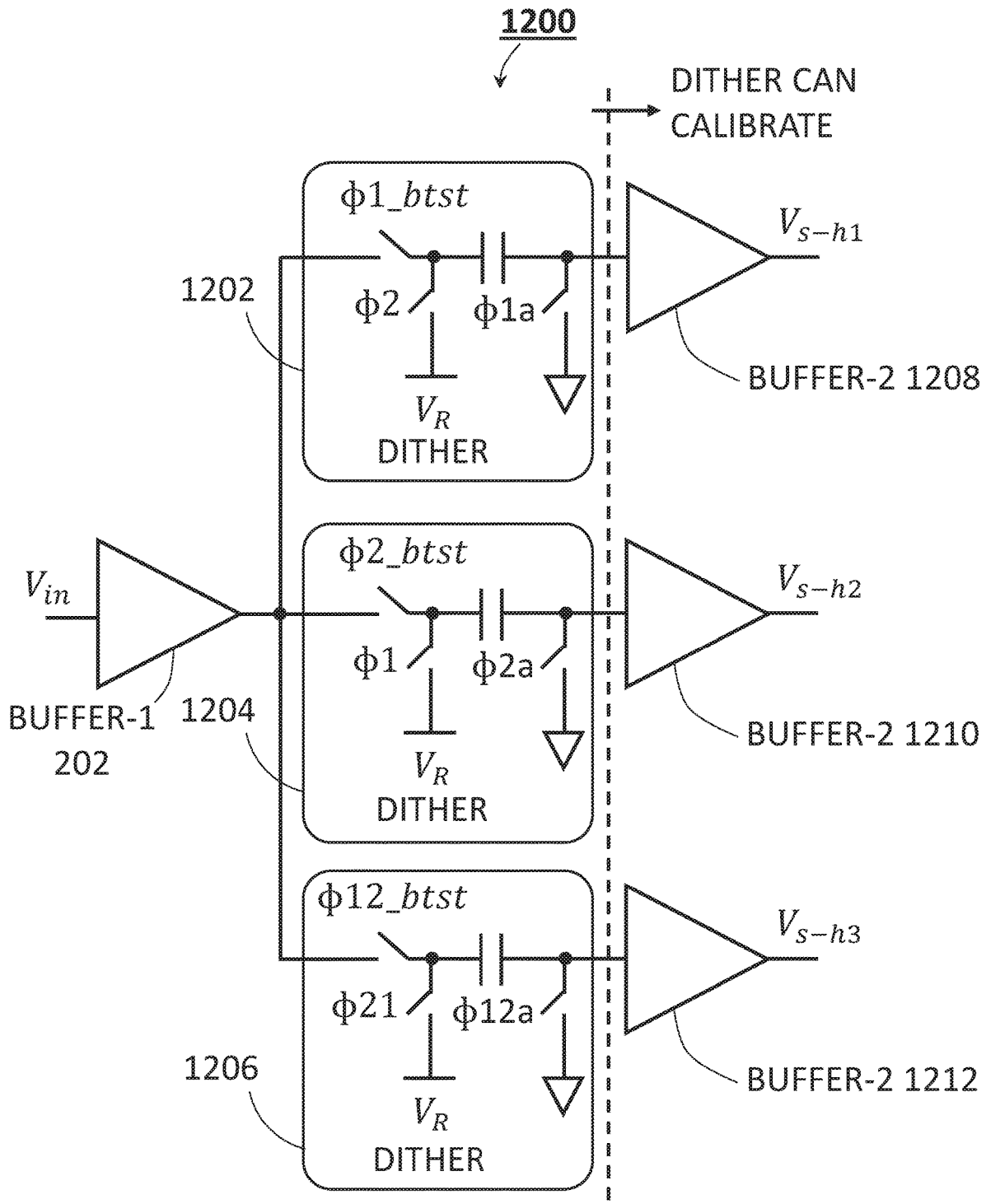
FIG. 12 shows an exemplary track and hold circuit with multiple time-interleaved sampling networks and multiple hold buffers, according to some embodiments of the disclosure.

In some embodiments, rather than having a single hold buffer as seen in FIGS. 9-11, multiple hold buffers can be included in the T/H circuit with time-interleaved sampling networks. FIG. 12 shows an exemplary T/H circuit 1200 with multiple time-interleaved sampling networks and multiple hold buffers, according to some embodiments of the disclosure. The Having multiple hold buffers can provide better isolation between slices, and can reduce design requirements imposed on the individual hold buffers (with similar benefits as the example seen in FIG. 7). In this particular example, the T/H circuit has a sampling buffer 202, three sampling networks (shown as sampling networks 1202, 1204, and 1206), and three hold buffers (shown as Buffer-2 1208, Buffer-2 1210, and Buffer-2 1212). Each sampling network has a dedicated hold buffer to drive the ADC which follows the hold buffer. The hold buffers (Buffer-2 1208, Buffer-2 1210, and Buffer-2 1212) receive respective held signals from sampling networks (shown as sampling networks 1202, 1204, and 1206). With a dedicated hold buffer, the sampling networks can avoid having an output switch, if desired. Each one of the hold buffers can generate a respective output signal (shown as $V_{s-h1}$, $V_{s-h2}$, and $V_{s-h3}$) and drive a respective ADC.

For this particular example shown, two sampling networks can be randomly selected to be the next sampling network to sample the input to randomize mismatch errors between the sampling networks. The circuit design shown in FIG. 12 can be extended to higher number of sampling networks, each with a dedicated hold buffer.

One caveat of the randomized time-interleaving design illustrated by FIG. 12 having multiple dedicated hold buffers is that each dedicated hold buffer would have to drive M ADC slices, which can consume more power than a T/H circuit which performs sequential time-interleaving (where the dedicated hold buffer would only need to drive a fraction of the M ADC slices).

Track and Hold Circuits with Chopping

Figure 13A:
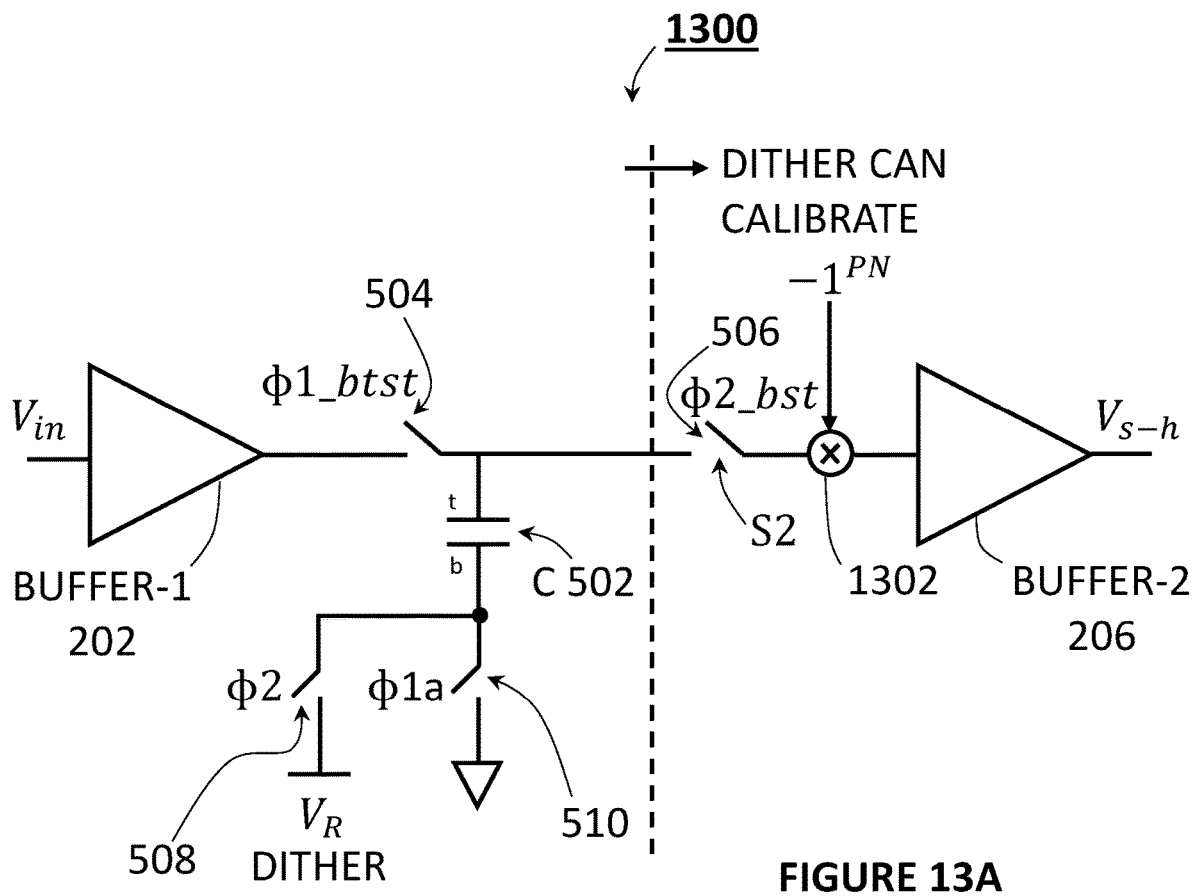
FIG. 13A shows an exemplary track and hold circuit with chopping to inject a multiplicative dither, according to some embodiments of the disclosure.

In addition to injecting additive dither, the T/H circuit can randomly chop the input signal by randomly changing polarities based on a pseudo-random code "PN". In other words, the T/H circuit can have multiplicative dither injected, where the dither can be a +1 or −1, as chosen by the code PN. FIG. 13A illustrates a T/H circuit 1300 with chopping to inject a multiplicative dither, according to some embodiments of the disclosure. A chopper 1302 performing a chopping function can be integrated with a switch in the sampling network, such as the input switch, or the output switch. To illustrate, the chopper 1302 is added to the embodiment seen in FIG. 5. The chopper 1302 can be added to other sampling networks described herein. While the chopper 1302 in this example seen in FIG. 13A is added/integrated with the output switch (e.g., output switch 506), it is envisioned that the chopper can be added/integrated with the input switch (e.g., input switch 504). The chopper 1302 can be integrated with the output switch (e.g., output switch 506) to inject the multiplicative dither.

Figure 13B:
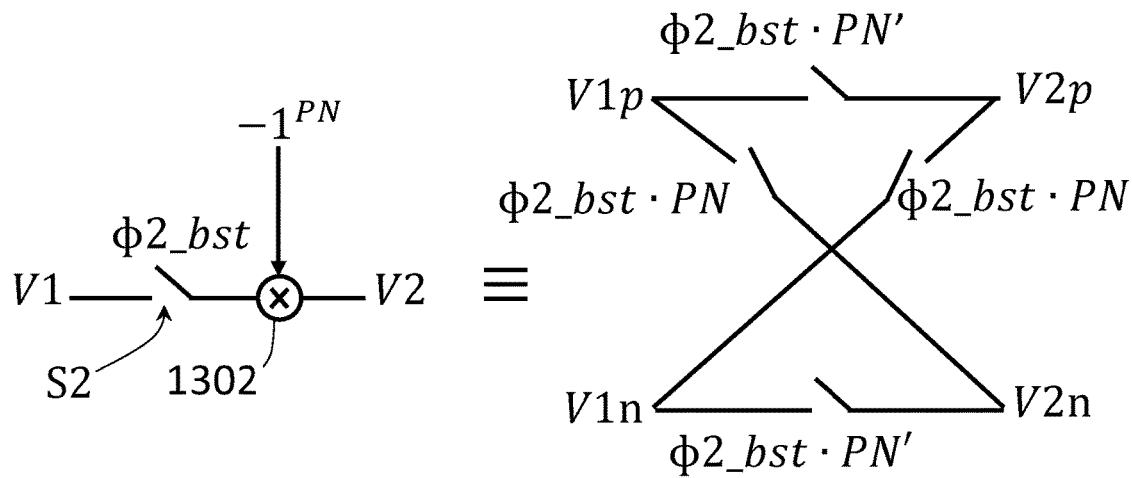
FIG. 13B illustrates integrating the chopper with a switch in the sampling network, according to some embodiments of the disclosure.

FIG. 13B illustrates integrating the chopper 1302 with a switch in the sampling network, according to some embodiments of the disclosure. Mathematically, the chopper 1302 multiplies the signal with a dither represented by $-1^{PN}$, where PN is a pseudo-random code having a value of [PN=0, PN'=1], or [PN=1, PN'=0]. For illustration, on the left hand side of FIG. 13B, an output switch S2 associated with phase $\phi 2\_bst$ is shown, followed with a chopping function represented by chopper 1302. This chopping function can be achieved in a differential circuit implementation seen on the right hand side of FIG. 13B. In a differential circuit, the node V1 on the left hand side of FIG. 13B is represented by differential nodes V1$p$ and V1$n$ respectively on the right hand side of FIG. 13B. The node V2 on the left hand side of FIG. 13B is represented by differential nodes V2$p$ and V2$n$ respectively on the right hand side of FIG. 13B. The circuit seen on the right hand side of FIG. 13B has straight forward paths and crisscross paths. The switches in these paths enables random switching between the straight forward paths and crisscross paths. The straight forward paths with switches associated with $\phi 2\_PN'$ (where PN' is the inverted PN) allows the differential signal at nodes V1$p$ and V1$n$ to pass straight through to nodes V2$p$ and V2$n$ respectively. The crisscross paths with switches associated with $\phi 2\_bst*PN$ invert the differential signal at nodes V1$p$ and V1$n$ and pass the differential signal to nodes V2$n$ and V2$p$ respectively. In other words, the multiplicative dither, $-1^{PN}$, can randomly swap positive and negative input paths. By randomly swap positive and negative input paths, the circuit seen in the right hand side of FIG. 13B effectively implements the chopping function and multiplies the signal by +1 or −1 randomly.

By randomly swapping the positive and negative input paths, the DC (direct current) component of the input signal can be randomized, making it easier to calibrate for any offset mismatches between the different slices. The chopping function can be implemented with the input switch of the sampling network, which can randomly invert the signal in the sampling phase. The chopping function can be implemented with the output switch, which can randomly invert the signal in the hold phase. In some cases, the chopping function can be implemented with both the input switch and the output switch using different PN codes.

Figure 14:
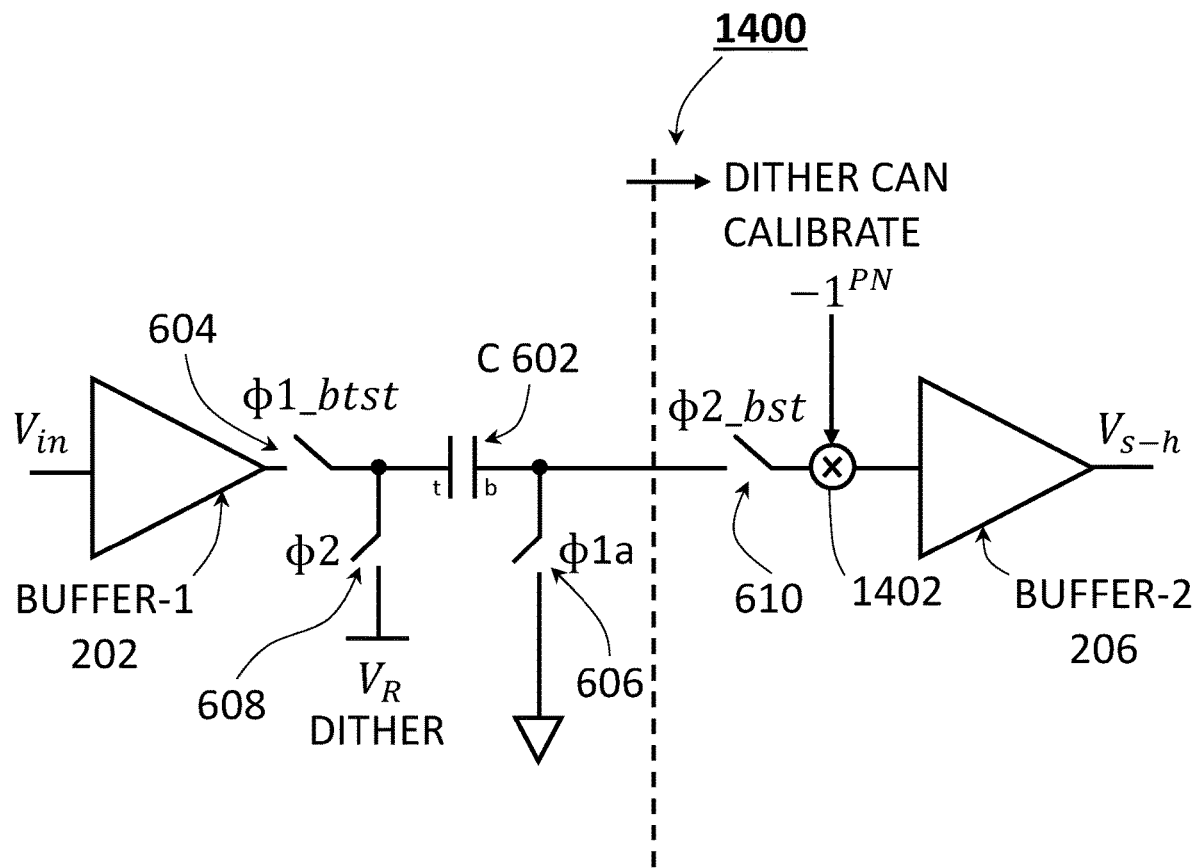
FIG. 14 shows another exemplary track and hold circuit with chopping to inject a multiplicative dither, according to some embodiments of the disclosure.

FIG. 14 illustrates another exemplary T/H circuit 1400 with chopping to inject a multiplicative dither, according to some embodiments of the disclosure. A chopper 1402 performing a chopping function can be integrated with a switch in the sampling network, such as the input switch, or the output switch. To illustrate, the chopper 1402 is added to the embodiment seen in FIG. 6. The chopper 1402 can be added to other sampling networks described herein. While the chopper 1402 in this example seen in FIG. 14 is added/integrated with the output switch (e.g., output switch 610), it is envisioned that the chopper can be added/integrated with the input switch (e.g., input switch 604). The chopper 1402 can be integrated with the output switch (e.g., output switch 506) to inject the multiplicative dither.

Figure 15:
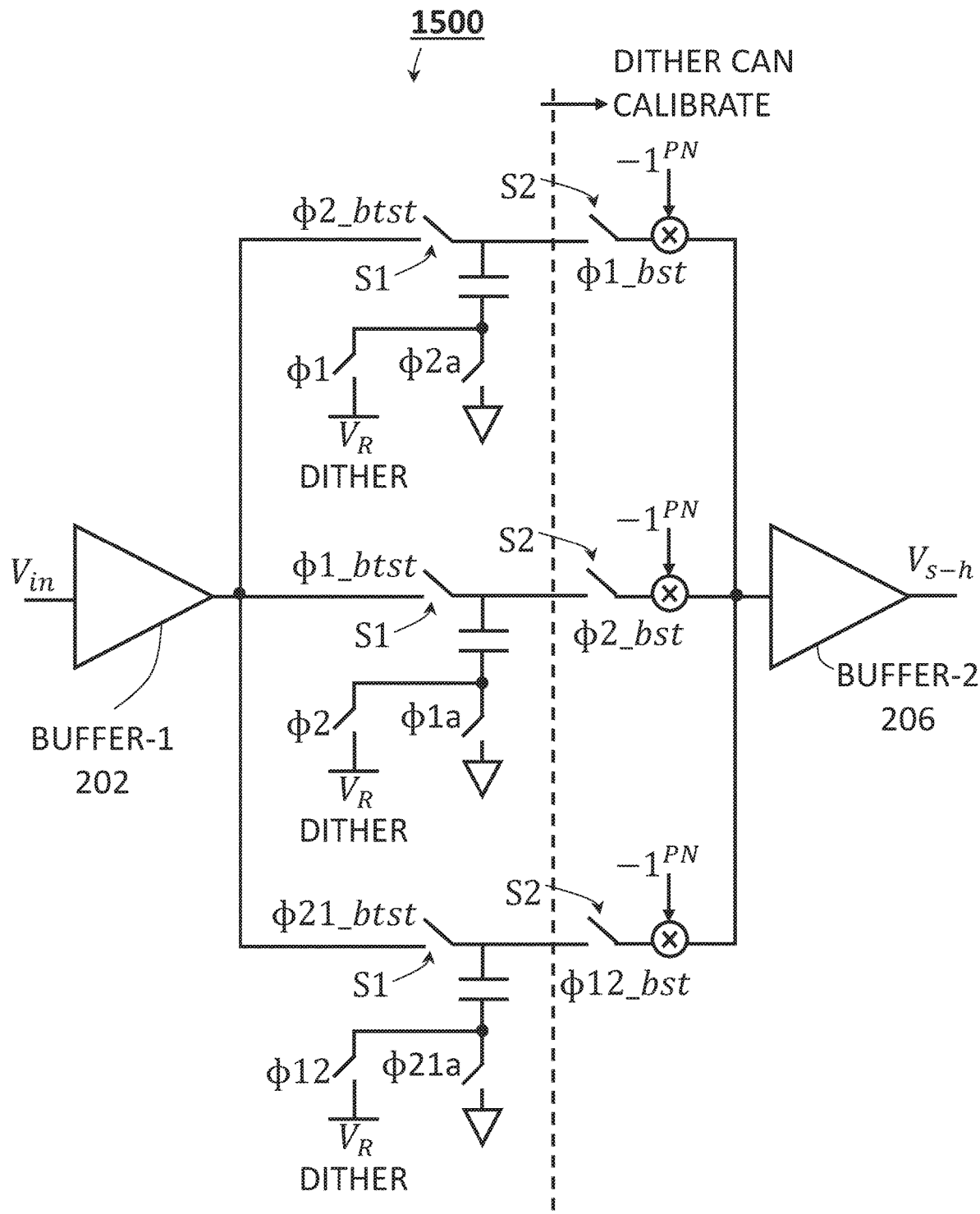
FIG. 15 shows an exemplary track and hold circuit with multiple sampling networks with chopping added to inject a multiplicative dither, according to some embodiments of the disclosure.

FIG. 15 shows an exemplary T/H circuit 1500 with multiple sampling networks with chopping added to inject a multiplicative dither, according to some embodiments of the disclosure. Chopping is added to the exemplary T/H circuit 1100 of FIG. 11. Specifically, as an example, the chopping function is integrated with the output switches labeled S2 associated with $\phi 1\_bst$, $\phi 2\_bst$, and $\phi 12\_bst$. In the alternative, the chopping function can be integrated with the input switches labeled S1 associated with $\phi 2\_btst$, $\phi 1\_btst$, and $\phi 21\_btst$. The former has the additional advantage that the chopper can be calibrated by the additive dither if desired. This chopping can then be reapplied on the digital side after offset calibration to restore the original signal.

Figure 16:
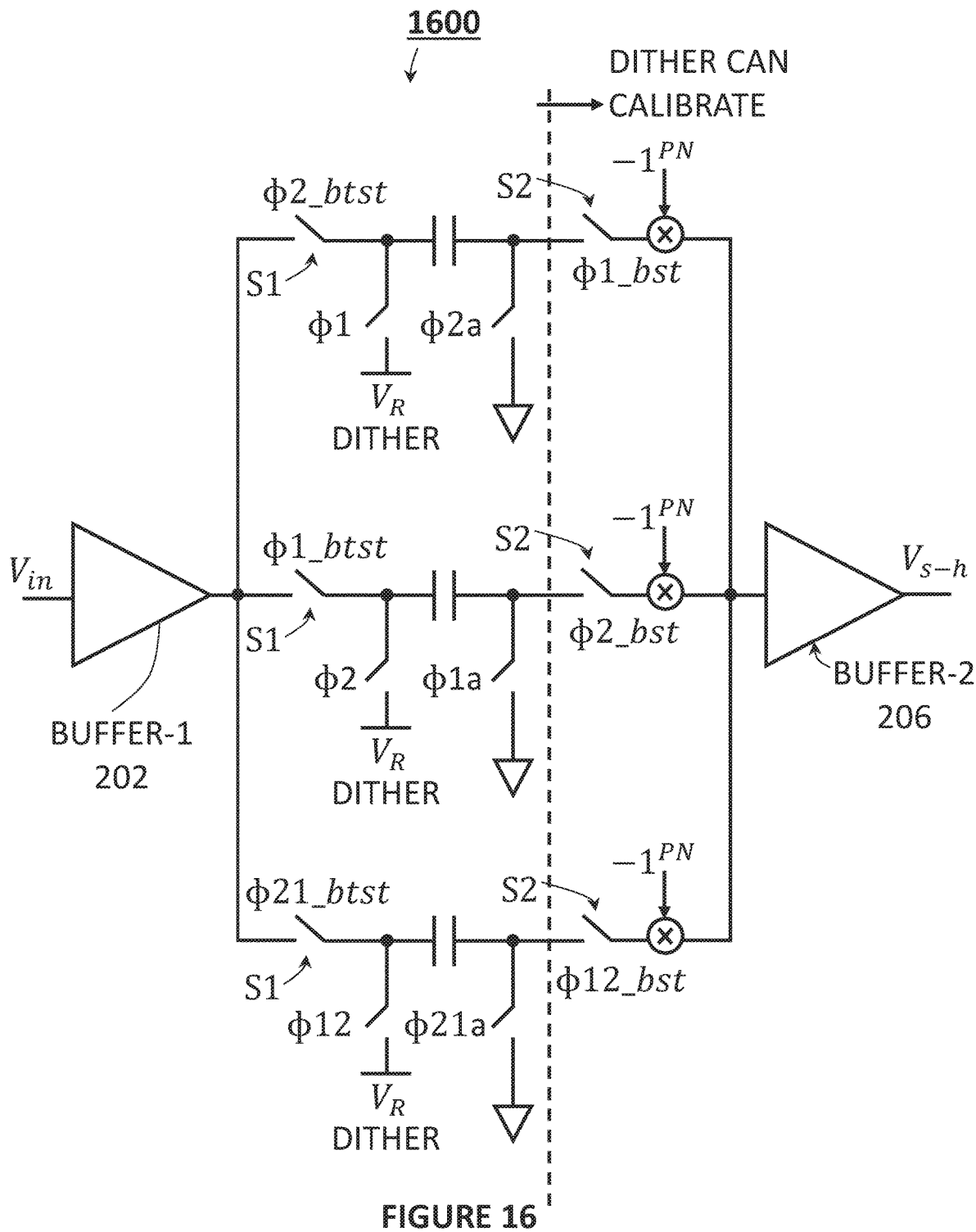
FIG. 16 shows another exemplary track and hold circuit with chopping to inject a multiplicative dither, according to some embodiments of the disclosure.

FIG. 16 shows another exemplary T/H circuit 1600 with multiple sampling networks with chopping added to inject a multiplicative dither, according to some embodiments of the disclosure. Specifically, as an example, the chopping function is integrated with the output switches labeled S2 associated with $\phi 1\_bst$, $\phi 2\_bst$, and $\phi 12\_bst$. In the alternative, the chopping function can be integrated with the input switches labeled S1 associated with $\phi 2\_btst$, $\phi 1\_btst$, and $\phi 21\_btst$. The former has the additional advantage that the chopper can be calibrated by the additive dither if desired. This chopping can then be reapplied on the digital side after offset calibration to restore the original signal.

Chopping can be useful for offset mismatch calibration, where the chopping function can converts any input offset and/or signals at problematic frequencies (such as $f_s/M$, and $f_s/2M$, where M is the number of slices) into noise, e.g., so as to not impact the offset convergence and removal of the offset. Chopping can also help with even-order distortions or to reduce even-order harmonics in the signal path. It is understood that while the chopping function can be integrated with a switch that is in the sampling network, it is possible to include/integrate a chopper at any point in the signal path, such as at the output of Buffer-1 202.

Handling Output Routing Parasitics and Load on the Track and Hold Circuit

Figures 17A, 17B:
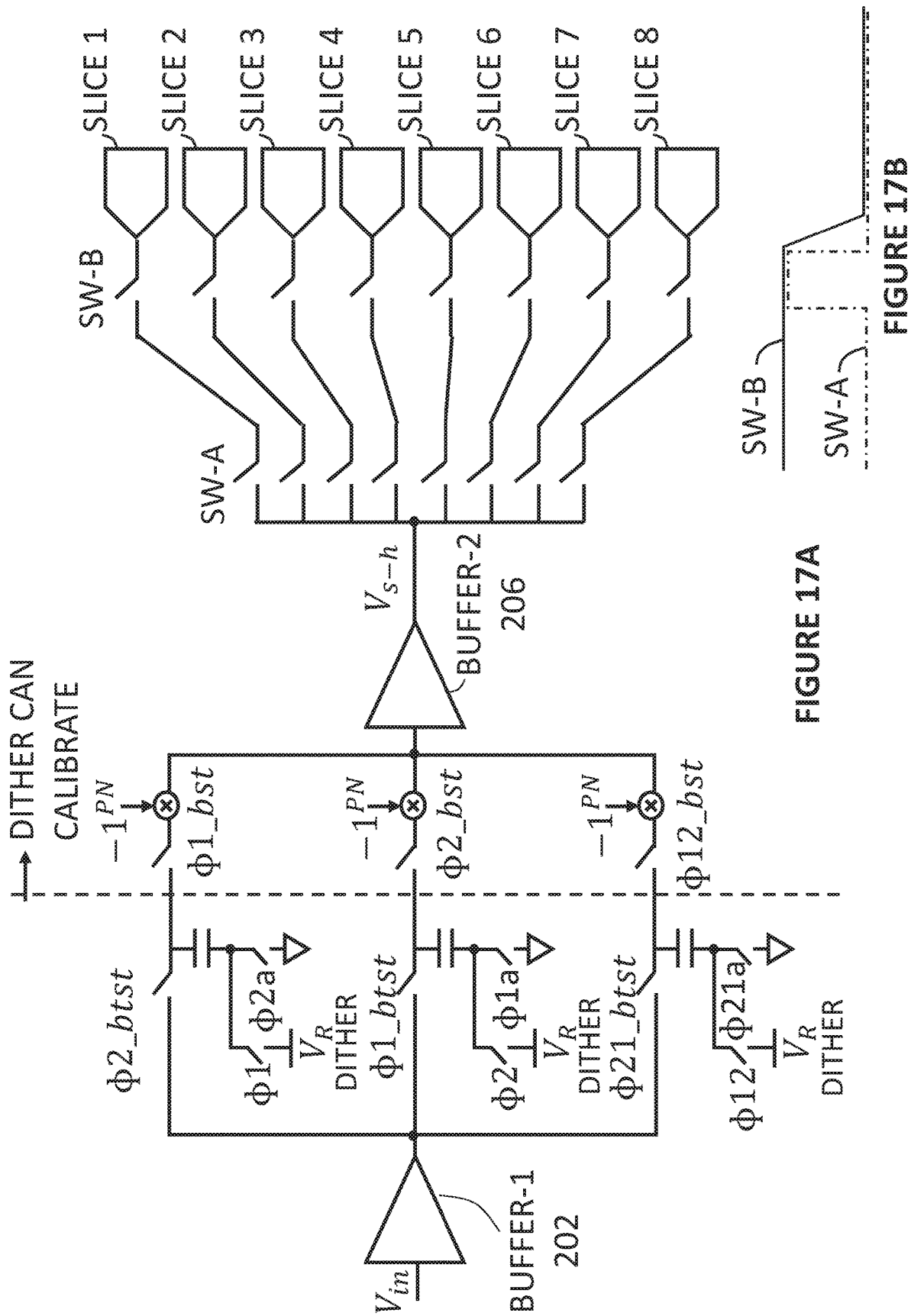
FIG. 17A show an exemplary track and hold circuit driving 8 slices, according to some embodiments of the disclosure.
FIG. 17B show a timing diagram for controlling two serial switches in the circuit illustrated by FIG. 17A, according to some embodiments of the disclosure.

Driving M ADC slices is not trivial. Suitable switches and switching scheme can address parasitics and loading effects on the T/H circuit. Consider driving 8 ADC slices in the following example. FIG. 17A shows an exemplary T/H circuit driving 8 slices, according to some embodiments of the disclosure. For each signal path from the T/H circuit to an ADC slice, two serial switches are implemented to manage the parasitics and load on the track and hold circuit. The first set of switches are labeled "SW-A", and they are positioned close to the output of Buffer-2. The second set of switches are labeled "SW-B", and they are positioned close to the input of the ADC slices. A SW-A switch, when on or closed, couples an output of the Buffer-2 206 to a SW-B switch (or transmits/conducts the signal from the output of the Buffer-2 206) to a terminal of the SW-B switch). The SW-B switch, when on or closed, couples the SW-A switch to an input of an ADC slice (or transmits/conducts a signal at a terminal of the SW-A switch to the input of the ADC slice). The two serial switches, SW-A and SW-B, can be separated by a transmission line or wire of a certain length for routing the buffered signal from Buffer-2 206 to the respective ADC slices.

A timing diagram in FIG. 17B illustrates the timing of a SW-A switch and a SW-B switch for a particular ADC slice when the ADC slice is selected to perform conversion. The SW-A switch, whose timing is illustrated in the timing diagram in FIG. 17B, is turned on quickly and turned off quickly at the fast rate of $f_s$ (the overall sampling frequency of the data converter). In other words, the SW-A switch is turned on with a short pulse, since the SW-A switch hands off data from the fast (full-speed) T/H circuit to a slow ADC slice. The SW-B switch, whose timing is also illustrated in the timing diagram above, can operate at a slower speed. A SW-B switch can be on before SW-A switch is turned on, and can turn off at the same time or just after SW-A switch is turned off. The switches can be simple transmission gates (not bootstrapped switches), thus the penalty of having both switches is not significant.

The SW-A switch is placed close (in layout) to the T/H circuit, and can help minimize the parasitic loading effect on the Buffer-2 caused by the slices which are not connected to the T/H circuit. Since the SW-A switch is not close to the ADC slice, the load on the ADC slice is left unaddressed in the absence of the SW-B switch. The SW-B switch is placed close (in layout) to the ADC slice, and can help reduce the load on the T/H circuit by connecting the T/H circuit to one ADC slice at a time. SW-B minimizes the routing seen by the ADC slice and the T/H circuit when resetting. Therefore, SW-B can minimize the parasitics needed for resetting this node when it is not being used. By using two serial switches and proper timing, SW-A and SW-B switches ensure that whenever a selected ADC slice is connected to the T/H circuit to receive a held sample, only the parasitics of the selected ADC slice is loading the Buffer-2 206 of the T/H circuit (all the other ADC slices are disconnected from the Buffer-2 206). Together, the SW-A and the SW-B switch can help reduce routing parasitics load on the T/H circuit and on the selected ADC slice.

It is preferable to use both SW-A and SW-B switches for each signal path from the T/H circuit to the ADC slice. It is envisioned that one of the two switches can be omitted, in some less preferred embodiments. For instance, in some cases, only the SW-A switches are provided, while the SW-B switches are omitted.

Addressing Common Memory in Time-Interleaved Sampling Networks

When parallel sampling networks are time-interleaved, some common memory at a global input node of the sampling networks can be present between a hold phase to a sample phase. This common memory can be seen by all of the sampling networks, and this common memory is not the same as the memory within the sampling capacitor(s) addressed by adding a reset phase. To address the common memory issue, clock signals driving the switches in the sampling network can overlap to allow for to allow for brief resetting of the global input node.

The overlap in the clock signals is between the bottom plate sampling switch, and the dither injection switch and the output switch (labeled "S2"). It can be that the output switch closes before the bottom plate sampling switch is opened, or the bottom plate sampling switch closes before the output switch is opened. The latter case is preferred, because the former case can impact the sampled value on the cap, but both are viable.

Referring to FIGS. 15 and 16, the overlapping would occur between clock signals associated with phase φ1/φ1_*bst* (including the dither injection switch and the output switch), and φ2*a* (including the bottom plate sampling switch) for the top sampling network. Overlapping would also occur between clock signals associated with phase φ2/φ2_*bst* (including the dither injection switch and the output switch), and φ1*a* (including the bottom plate sampling switch) for the middle sampling network. The overlapping would occur between clock signals associated with phase φ12/φ12_*bst* (including the dither injection switch and the output switch), and φ21*a* (including the bottom plate sampling switch) for the bottom sampling network as well.

Focusing on the top sampling network as an example, the overlap can mean that either (1) φ1/φ1_*bst* close the dither injection switch and output switch before φ2*a* opens the bottom plate sampling switch, or (2) φ2*a* closes the bottom plate sampling switch before φ1/φ1_*bst* open the dither injection switch and output switch. The latter is again better, because the former would possibly negatively impact the sample before it is taken. But both are viable.

Phrased differently, the overlap preferably happens at the end of the hold phase and beginning of sampling phase (when the bottom plate sampling switch closes), and is less preferred at the end of the sampling phase and beginning of the hold phase (when the dither injection switch and the output switch close). This overlap can help reset this global input node to reduce the common memory that is seen by all tracks.

Flexible Architecture

The design and implementation of the T/H circuit can be varied to accommodate different functionalities and features. The number of sampling networks, the number of hold buffers, and the number of ADC slices that a hold buffer is driving, can all vary.

As discussed previously, the T/H circuit can include one or more sampling networks in parallel. The number of sampling networks within the T/H circuit can vary depending on the design. For instance, the number can be chosen based on the interleaving factor and amount of randomization. For example, a T/H circuit can have one sampling network and one hold buffer (e.g., FIGS. 2-6). In another example, a T/H circuit can have one sampling network and X number of hold buffers (e.g., FIG. 7). X is at least two. In yet another example, a T/H circuit can have X number of sampling networks and one hold buffer (e.g., FIGS. 8A, 9-11, 15, 16, and 17A). In a further example, a T/H circuit can have X number of sampling networks and X number of hold buffers (e.g., FIG. 12).

Also, the T/H circuit can include one or more hold buffers. In some cases, there is one buffer to one sampling network. For example, the T/H circuit can have one sampling network, and the sampling network drives one hold buffer (e.g., FIGS. 2-6). In another example, the T/H circuit can have X number of sampling networks and X number of hold buffers (e.g., FIG. 12). In some cases, there is multiple buffers to one sampling network. For example, the T/H circuit can have one sampling network, and X number of hold buffers (e.g., FIG. 7). In another example, the T/H circuit can have X number of sampling networks, and X*N number of hold buffers. N is at least two, representing the number of hold buffers per sampling network. If a T/H circuit has four sampling networks, there can be eight hold buffers in total, with two hold buffers per sampling network. In yet another example, the T/H circuit can have X number of sampling networks, and Y number of hold buffers, where Y is greater than X. Each sampling network can drive one or more hold buffers (where the number of hold buffers for each sampling network may not be the same).

Furthermore, the T/H circuit can drive one or more ADC slices. The ADC slices can operate in parallel, and in some cases, the ADC slices can operate in a time-interleaved or a randomized time-interleaved manner. For example, a T/H circuit can drive one ADC slice. In another example, the T/H circuit can drive M ADC slices (e.g., FIGS. 1 and 17A). M is at least two, representing the number of ADC slices of the overall ADC. If the T/H circuit has one hold buffer, the hold buffer can drive all M ADC slices (e.g., FIG. 17A). If the T/H circuit has M number of hold buffers, several variations are available. In a first example, each hold buffer can drive a respective ADC slice. In a second example, each hold buffer can drive all M ADC slices. In a third example, each hold buffer can drive only a subset or fraction of M ADC slices. If the T/H circuit has N number of hold buffers, where N is less than M, several variations are also available. In a first example, each hold buffer can drive all M ADC slices. In one instance of the first example, a T/H circuit can have four sampling networks, and one hold buffer. The hold buffer can drive a total and all of 8 ADC slices. In a second example, each hold buffer can drive a subset or fraction of M ADC slices. In one instance of the second example, the T/H circuit can have four sampling networks, and four hold buffers (each hold buffer coupled to a corresponding sampling network). Each hold buffer can drive two ADC slices. The overall T/H circuit can drive a total of 8 ADC slices.

Method for Sampling with Calibration

Figure 18:
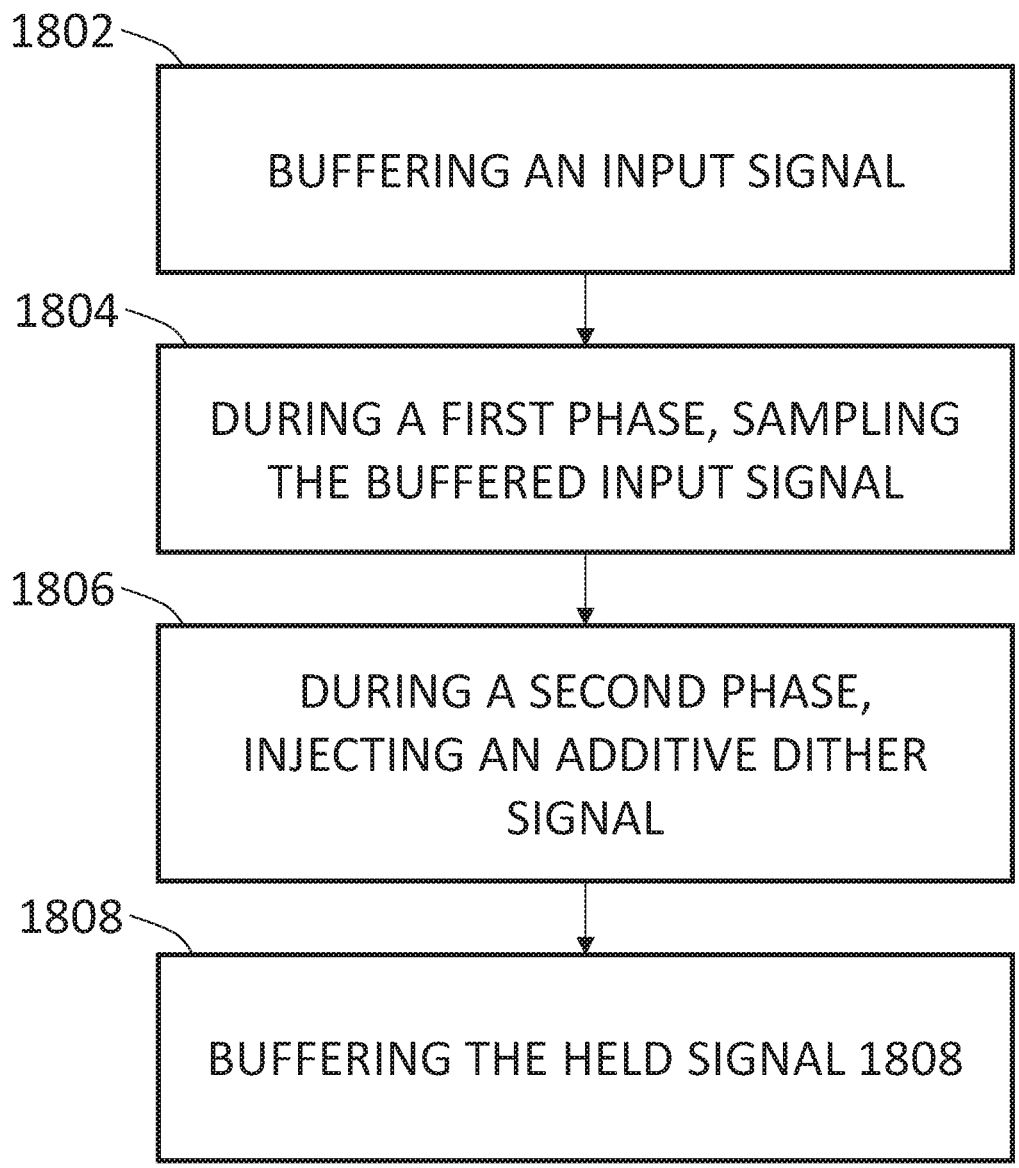
FIG. 18 shows a flow diagram illustrating a method for sampling an input signal with calibration, according to some embodiments of the disclosure.

FIG. 18 shows a flow diagram illustrating a method for sampling an input signal with calibration, according to some embodiments of the disclosure. In 1802, an input signal is buffered. In 1804, during a first phase, the buffered input signal is sampled onto a capacitor in a sampling network. In 1806, during a second phase, an additive dither signal is injected to the capacitor in the sampling network and outputting a held signal having an input signal sampled on the capacitor and the additive dither signal. In 1808, the held signal is buffered to generate a buffered signal for driving one or more analog-to-digital converters.

EXAMPLES

Example 1001 is track and hold circuit comprising a sampling buffer, a sampling network receiving a buffered input from the sampling buffer, and a hold buffer receiving a held signal from the sampling network.

In Example 1002, the track and hold circuit of Example 1001 can further the sampling network comprising a node for receiving an additive dither.

In Example 1003, the track and hold circuit of Example 1001 or 1002 can further include a chopper integrated with the sampling network.

In Example 1004, the track and hold circuit of any one of Examples 1001-1003 can further include one or more further sampling networks in parallel.

In Example 1005, the track and hold circuit of Example 1004 can further include the sampling networks sampling the buffered input from the sampling buffer in a time-interleaved manner.

In Example 1006, the track and hold circuit of Example 1004 or 1005 can further include the sampling networks sampling the buffered input from the sampling buffer in a randomized time-interleaved manner.

In Example 1007, the track and hold circuit of any one of Examples 1004-1006 can further include the sampling networks being configurable to sample the buffered input in different modes.

In Example 1008, the track and hold circuit of any one of Examples 1001-1007 can further include one or more further hold buffers.

In Example 1009, the track and hold circuit of any one of Examples 1004-1007 can further include one or more further hold buffers each dedicated to each sampling network.

Example 101 is a method comprising: buffering an input signal; during a sampling phase, sampling the buffered input signal onto a capacitor; and during a hold phase, connecting a node having a dither signal to the capacitor to output a held signal having the dither signal; buffering the held signal.

In Example 102, the method of Example 101 can further include randomly chopping the held signal prior to buffering the held signal.

In Example 103, the method of Example 101 or 102 can further include driving a plurality of ADCs which are operating in a time-interleaved manner.

In Example 104, the method of any one of Examples 101-103 can further include calibrating, based on the additive dither, one or more of the following non-idealities: non-linearity of the hold phase of the track and hold circuit, non-linearity of one or more analog-to-digital converters being driven by the track and hold circuit, gain mismatch between a plurality of time-interleaved analog-to-digital converters being driven by the track and hold circuit, offset mismatch between the plurality of time-interleaved analog-to-digital converters.

In Example 105, the method of any one of Examples 101-104 can further include calibrating, based on the multiplicative dither, offset mismatch between a plurality of time-interleaved analog-to-digital converters being driven by the track and hold circuit.

Example A is an apparatus comprising means for implementing/carrying out any one of the methods described herein.

Example 1 is a low-power track and hold circuit, the track and hold circuit comprising: a sampling buffer; a sampling network, with dither injection, to receive a buffered input from the sampling buffer; and a hold buffer to receive a held signal from the sampling network. The sampling buffer and/or the hold buffer can be omitted in some cases.

In Example 2, Example 1 can optionally include the sampling network comprising a node to receive an additive dither.

In Example 3, Example 1 or 2 can optionally include a chopper integrated with the sampling network to inject a multiplicative dither.

In Example 4, any one of Examples 1-3 can optionally include the sampling network comprising a switched-capacitor network to sample the buffered input from the sampling buffer onto one or more capacitors.

In Example 5, any one of Examples 1-4 can optionally include the hold buffer (and/or the sampling buffer) comprising a variable gain amplifier. In some cases, a variable gain amplifier is added in front of the track and hold circuit.

In Example 6, Examples 5 can optionally include a signal level detector to detect an overload condition and generate a gain control signal of the variable gain amplifier.

In Example 7, any one of Examples 2-6 can optionally include the sampling network comprising: an input switch to receive the buffered input from the sampling buffer; a sampling switch to sample the buffered input onto a capacitor during a sampling phase; and a dither injection switch to connect the capacitor to a node having the additive dither.

In Example 8, any one of Examples 1-7 can optionally include the sampling network further comprising an output switch to connect a capacitor in the sampling network to the hold buffer during a hold phase.

In Example 9, any one of Examples 1-8 can optionally include one or more further hold buffers in parallel with the hold buffer to receive the held signal from the sampling network, wherein the hold buffer and the one or more further hold buffers drive respective analog-to-digital converters.

In Example 10, any one of Examples 1-9 can optionally include one or more further sampling networks in parallel with the sampling network, wherein the sampling network and the one or more further sampling networks sample the buffered input from the sampling buffer in a time-interleaved manner.

In Example 11, any one of Examples 1-10 can optionally include one or more further sampling networks in parallel with the sampling network, wherein the sampling network and the one or more further sampling networks sample the buffered input from the sampling buffer in a randomized time-interleaved manner.

In Example 12, any one of Examples 1-11 can optionally include the sampling network and the one or more further sampling networks being configurable to sample the buffered input in different modes.

In Example 13, any one of Examples 10-12 can optionally include one or more further hold buffers in parallel with the hold buffer, wherein the one or more further hold buffers receive one or more respective held signals from the one or more further sampling networks.

In Example 14, any one of Examples 1-13 can optionally include two serial switches including a first switch in series with a second switch, wherein the first switch couples an output of the hold buffer to the second switch, the second switch couples the first switch to an input of a first one of a plurality of analog-to-digital converters, and the second switch operates at a slower speed than the first switch.

Example 15 is a method for sampling an input signal with calibration, the method comprising: buffering an input signal; during a first phase, sampling the buffered input signal onto a capacitor in a sampling network; during a second phase, injecting an additive dither signal to the capacitor in the sampling network and outputting a held signal having an input signal sampled on the capacitor and the additive dither signal; and buffering the held signal to generate a buffered signal for driving one or more analog-to-digital converters.

In Example 16, Example 15 can optionally include randomly chopping a signal in the sampling network based on a multiplicative dither.

In Example 17, Example 15 or 16 can optionally include the one or more analog-to-digital converters comprising time-interleaved analog-to-digital converters.

In Example 18, any one of Examples 15-17 can optionally include interleaving a further sampling network to sample the buffered input signal during the second phase.

In Example 19, Example 18 can optionally include the further sampling network being selected at random from a plurality of available sampling networks.

Example 20 is a time-interleaved analog-to-digital converter with calibration, the time-interleaved analog-to-digital converter comprising: a plurality of analog-to-digital converters operating in a time-interleaved fashion; and an open loop track and hold circuit operating at a full-speed of the time-interleaved analog-to-digital converter and driving the plurality of analog-to-digital converters, wherein the open loop track and hold circuit comprises at least one buffer and a sampling network with dither injection.

VARIATIONS AND IMPLEMENTATIONS

Herein, switches represents electronic circuitry which can be controlled to conduct a signal (e.g., current) or not conduct the signal (e.g., current). In practice, switches can be implemented using transistors. By biasing the transistors appropriately, the transistor can conduct current or not conduct current (be "on" or "off" respectively). When the switch is closed or "on", current conducts to complete the circuit path. When a switch is opened or "off", current does not conduct and the circuit path is open. Switches can effectively connect/couple one part of a circuit to another part of a circuit, or disconnect/decouple one part of a circuit to another part of a circuit.

Note that the activities discussed above with reference to the FIGURES are applicable to any integrated circuits that involve processing analog signals and converting the analog signals into digital data using one or more ADCs. In certain contexts, the features discussed herein related to ADCs in general, including, e.g., ADCs of various flavors including pipeline ADCs, delta sigma ADCs, successive approximation register ADCs, multi-stage ADCs, time-interleaved ADCs, randomized time-interleaved ADCs, etc. The features can be particularly beneficial to high speed ADCs, where input frequencies are relatively high in the giga-hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beamforming communication systems, broadband communication systems, high performance imaging, and advanced test/measurement systems (oscilloscopes).

The present disclosure encompasses apparatuses which can perform extraction and calibration of non-idealities described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on a non-transitory computer medium.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims or examples described herein. Note that all optional features of the apparatus described above may also be implemented with respect to the method or process described herein and specifics in the examples may be used anywhere in one or more embodiments.

What is claimed is:

1. A low-power track and hold circuit, the low-power track and hold circuit comprising:
   a sampling buffer;
   a sampling network, with dither injection, to receive a buffered input from the sampling buffer, the sampling network comprising:
     an input switch to receive the buffered input from the sampling buffer;
     a sampling switch to sample the buffered input onto a capacitor during a first phase;
     a node to receive an additive dither during a second phase; and
   a hold buffer to receive a held signal from the sampling network, wherein the held signal comprises the buffered input sampled onto the capacitor and the additive dither.

2. The low-power track and hold circuit of claim 1, wherein the input switch is bootstrapped to the buffered input.

3. The low-power track and hold circuit of claim 1, wherein the sampling network further comprises:
   a chopper integrated with the sampling network to inject a multiplicative dither.

4. The low-power track and hold circuit of claim 1, wherein the additive dither is generated by a digital-to-analog converter.

5. The low-power track and hold circuit of claim 1, wherein the hold buffer comprises a variable gain amplifier.

6. The low-power track and hold circuit of claim 5, further comprising:
   a signal level detector to detect an overload condition and generate a gain control signal of the variable gain amplifier.

7. The low-power track and hold circuit of claim 1, wherein the sampling network comprises:
   a dither injection switch to connect the capacitor in the sampling network to the node receiving the additive dither.

8. The low-power track and hold circuit of claim 1, wherein the sampling network further comprises an output switch to connect the capacitor in the sampling network to the hold buffer during the second phase.

9. The low-power track and hold circuit of claim 1, further comprising:
   one or more further hold buffers in parallel with the hold buffer to receive the held signal from the sampling network, wherein the hold buffer and the one or more further hold buffers drive respective analog-to-digital converters.

10. The low-power track and hold circuit of claim 1, further comprising:
    one or more further sampling networks in parallel with the sampling network, wherein the sampling network and the one or more further sampling networks sample the buffered input from the sampling buffer in a time-interleaved manner.

11. The low-power track and hold circuit of claim 10, wherein the sampling network and the one or more further sampling networks are configurable to sample the buffered input in different modes.

12. The low-power track and hold circuit of claim 10, further comprising:
    one or more further hold buffers in parallel with the hold buffer, wherein the one or more further hold buffers receive one or more respective held signals from the one or more further sampling networks.

13. The low-power track and hold circuit of claim 1, further comprising:
    one or more further sampling networks in parallel with the sampling network, wherein the sampling network and the one or more further sampling networks sample the buffered input from the sampling buffer in a randomized time-interleaved manner.

14. The low-power track and hold circuit of claim 1, further comprising:
    two serial switches including a first switch in series with a second switch, wherein the first switch couples an output of the hold buffer to the second switch, the second switch couples the first switch to an input of a first one of a plurality of analog-to-digital converters, and the second switch operates at a slower speed than the first switch.

15. A method for sampling an input signal with calibration, the method comprising:
    buffering an input signal;
    during a first phase, sampling the buffered input signal onto a capacitor in a sampling network;

during a second phase, injecting an additive dither signal to the capacitor in the sampling network and outputting a held signal having an input signal sampled on the capacitor and the additive dither signal; and buffering the held signal to generate a buffered signal for driving one or more analog-to-digital converters.

16. The method of claim 15, further comprising:
randomly chopping a signal in the sampling network based on a multiplicative dither.

17. The method of claim 15, wherein the one or more analog-to-digital converters comprises time-interleaved analog-to-digital converters.

18. The method of claim 15, further comprising:
interleaving a further sampling network to sample the buffered input signal during the second phase.

19. The method of claim 18, wherein the further sampling network is selected at random from a plurality of available sampling networks.

20. A time-interleaved analog-to-digital converter with calibration, the time-interleaved analog-to-digital converter comprising:

an open loop track and hold circuit with dither injection to operate at a sample rate of the time-interleaved analog-to-digital converter, the open loop track and hold circuit comprising:
at least one buffer; and
a sampling network to sample a buffered input onto a capacitor during a first phase and to inject a dither in a second phase; and a plurality of analog-to-digital converters to operate in a time-interleaved fashion, each analog-to-digital converter operating at a rate slower than the sample rate and receiving a same held signal from the open loop track and hold circuit.

* * * * *